(12) United States Patent
Portman et al.

(10) Patent No.: US 6,912,150 B2
(45) Date of Patent: Jun. 28, 2005

(54) REFERENCE CURRENT GENERATOR, AND METHOD OF PROGRAMMING, ADJUSTING AND/OR OPERATING SAME

(76) Inventors: Lionel Portman, Av. Floréal, 9, Lausanne (CH); Maher Kayal, Ch. de l'Ochettaz 11, St Sulpice (CH); Marc Pastre, Ch. de Champ-Colomb 6, Ecublens (CH); Marija Blagojevic, Rue du Maupas 42, Lausanne (CH); Michel Declercq, Ch. du Mont-Blanc 2, Penthaz (CH)

(*) Notice: Subject to any disclaimer, the term of this patent is extended or adjusted under 35 U.S.C. 154(b) by 0 days.

(21) Appl. No.: 10/840,902

(22) Filed: May 7, 2004

(65) Prior Publication Data

US 2004/0227166 A1 Nov. 18, 2004

Related U.S. Application Data

(60) Provisional application No. 60/470,276, filed on May 14, 2003, and provisional application No. 60/470,462, filed on May 13, 2003.

(51) Int. Cl.[7] .............................................. G11C 11/24
(52) U.S. Cl. .................... 365/149; 365/210; 365/230.06
(58) Field of Search ................................. 365/149, 210, 365/230.06, 189.01; 257/296, 314, 315

(56) References Cited

U.S. PATENT DOCUMENTS

| | | | |
|---|---|---|---|
| 3,439,214 A | 4/1969 | Kabell | |
| 3,997,799 A | 12/1976 | Baker | |
| 4,032,947 A | 6/1977 | Kesel et al. | |
| 4,298,962 A | 11/1981 | Hamano et al. | |
| 4,791,610 A | 12/1988 | Takemae | |
| 4,979,014 A | 12/1990 | Hieda et al. | |
| 5,144,390 A | 9/1992 | Matloubian | |
| 5,258,635 A | 11/1993 | Nitayama et al. | |
| 5,388,068 A | 2/1995 | Ghoshal et al. | |
| 5,446,299 A | 8/1995 | Acovic et al. | |
| 5,448,513 A | 9/1995 | Hu et al. | |
| 5,466,625 A | 11/1995 | Hsieh et al. | |
| 5,489,792 A | 2/1996 | Hu et al. | |
| 5,528,062 A | 6/1996 | Hsieh et al. | |
| 5,568,356 A | 10/1996 | Schwartz | |
| 5,593,912 A | 1/1997 | Rajeevakumar | |
| 5,606,188 A | 2/1997 | Bronner et al. | |
| 5,627,092 A | 5/1997 | Alsmeier et al. | |
| 5,631,186 A | 5/1997 | Park et al. | |
| 5,696,718 A | 12/1997 | Hartmann | |
| 5,740,099 A | 4/1998 | Tanigawa | |

(Continued)

FOREIGN PATENT DOCUMENTS

| | | |
|---|---|---|
| EP | 0 030 856 | 6/1981 |
| EP | 0 350 057 B1 | 1/1990 |
| EP | 0 354 348 A2 | 2/1990 |

(Continued)

OTHER PUBLICATIONS

"A High–Speed Clamped Bit–Line Current–Mode Sense Amplifier", Blalock et al., IEEE Journal of Solid–State Circuits. vol. 26, No. 4, Apr. 1991, pp. 542–548.

(Continued)

*Primary Examiner*—Gene N. Auduong
(74) *Attorney, Agent, or Firm*—Neil A. Steinberg

(57) ABSTRACT

There are many inventions described and illustrated herein. In a first aspect, the present invention is a technique and circuitry for reading data that is stored in memory cells. In one embodiment of this aspect, the present invention is a technique and circuitry for generating a reference current that is used, in conjunction with a sense amplifier, to read data that is stored in memory cells of a DRAM device. The technique and circuitry for generating a reference current may be implemented using an analog configuration, a digital configuration, and/or combinations of analog and digital configurations.

31 Claims, 22 Drawing Sheets

U.S. PATENT DOCUMENTS

| | | |
|---|---|---|
| 5,778,243 A | 7/1998 | Aipperspach et al. |
| 5,780,906 A | 7/1998 | Wu et al. |
| 5,784,311 A | 7/1998 | Assaderaghi et al. |
| 5,811,283 A | 9/1998 | Sun |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 6,018,172 A | 1/2000 | Hidada et al. |
| 6,081,443 A | 6/2000 | Morishita |
| 6,096,598 A | 8/2000 | Furukawa et al. |
| 6,097,056 A | 8/2000 | Hsu et al. |
| 6,111,778 A | 8/2000 | MacDonald et al. |
| 6,121,077 A | 9/2000 | Hu et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,708 B1 | 1/2001 | Kuang et al. |
| 6,214,694 B1 | 4/2001 | Leobandung et al. |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,262,625 B1 | 7/2001 | Perner et al. |
| 6,275,434 B1 | 8/2001 | Yamada et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,350,653 B1 | 2/2002 | Adkisson et al. |
| 6,351,426 B1 | 2/2002 | Ohsawa |
| 6,384,445 B1 | 5/2002 | Hidaka et al. |
| 6,391,658 B1 | 5/2002 | Gates et al. |
| 6,403,435 B1 | 6/2002 | Kang et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,538,916 B2 | 3/2003 | Ohsawa |
| 6,544,837 B1 | 4/2003 | Divakauni et al. |
| 6,548,848 B2 * | 4/2003 | Horiguchi et al. .......... 257/296 |
| 6,549,450 B1 | 4/2003 | Hsu et al. |
| 6,552,398 B2 | 4/2003 | Hsu et al. |
| 6,556,477 B2 | 4/2003 | Hsu et al. |
| 6,566,177 B1 | 5/2003 | Radens et al. |
| 6,567,330 B2 | 5/2003 | Fujita et al. |
| 6,586,989 B2 | 7/2003 | Perner et al. |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,661,042 B2 | 12/2003 | Hsu |
| 6,717,835 B2 | 4/2004 | Takemura et al. |
| 6,771,546 B2 | 8/2004 | Ikehashi et al. |
| 6,778,424 B2 * | 8/2004 | Iwata et al. ................. 365/149 |
| 6,781,875 B2 | 8/2004 | Ohsawa |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Hjoriguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0057487 A1 | 3/2003 | Yamada et al. |
| 2003/0057490 A1 | 3/2003 | Nagano et al. |
| 2003/0085758 A1 | 5/2003 | Perner et al. |
| 2003/0102497 A1 | 6/2003 | Fried et al. |
| 2003/0107920 A1 | 6/2003 | Roohparvar |
| 2003/0112659 A1 | 6/2003 | Ohsawa |
| 2003/0123279 A1 | 7/2003 | Aipperspach et al. |
| 2003/0146488 A1 | 8/2003 | Nagano et al. |
| 2003/0151112 A1 | 8/2003 | Yamada et al. |
| 2003/0168877 A1 | 9/2003 | Hsu |
| 2003/0213994 A1 | 11/2003 | Hayashi et al. |
| 2004/0021137 A1 | 2/2004 | Fazan et al. |
| 2004/0041206 A1 | 3/2004 | Bhattacharyya |
| 2004/0041208 A1 | 3/2004 | Bhattacharyya |
| 2004/0042268 A1 | 3/2004 | Bhattacharyya |
| 2004/0044838 A1 | 3/2004 | Nickel et al. |
| 2004/0052142 A1 | 3/2004 | Ikehashi et al. |
| 2004/0108532 A1 * | 6/2004 | Forbes ...................... 257/296 |
| 2004/0238890 A1 | 12/2004 | Fazan et al. |
| 2004/0240306 A1 | 12/2004 | Fazan et al. |

FOREIGN PATENT DOCUMENTS

| | | |
|---|---|---|
| EP | 0 202 515 B1 | 3/1991 |
| EP | 0 207 619 B1 | 8/1991 |
| EP | 0 175 378 B1 | 11/1991 |
| EP | 0 253 631 B1 | 4/1992 |
| EP | 0 513 923 | 11/1992 |
| EP | 0 300 157 B1 | 5/1993 |
| EP | 0 564 204 A2 | 10/1993 |
| EP | 0 579 566 A2 | 1/1994 |
| EP | 0 362 961 | 2/1994 |
| EP | 0 599 506 A1 | 6/1994 |
| EP | 0 359 551 B1 | 12/1994 |
| EP | 0 366 882 B1 | 5/1995 |
| EP | 0 465 961 B1 | 8/1995 |
| EP | 0 694 977 | 1/1996 |
| EP | 0 333 426 B1 | 7/1996 |
| EP | 0 727 820 A1 | 8/1996 |
| EP | 0 739 097 A2 | 10/1996 |
| EP | 0 245 515 B1 | 4/1997 |
| EP | 0 788 165 A2 | 8/1997 |
| EP | 0 801 427 | 10/1997 |
| EP | 0 510 607 B1 | 2/1998 |
| EP | 0 537 677 B1 | 8/1998 |
| EP | 0 858 109 A2 | 8/1998 |
| EP | 0 860 878 A2 | 8/1998 |
| EP | 0 869 511 A2 | 10/1998 |

| | | |
|---|---|---|
| EP | 0 878 804 | 11/1998 |
| EP | 0 920 059 A2 | 6/1999 |
| EP | 0 924 766 A2 | 6/1999 |
| EP | 0 642 173 B1 | 7/1999 |
| EP | 0 727 822 B1 | 8/1999 |
| EP | 0 933 820 A1 | 8/1999 |
| EP | 0 951 072 A1 | 10/1999 |
| EP | 0 971 360 A1 | 1/2000 |
| EP | 0 980 101 A2 | 2/2000 |
| EP | 0 601 590 B1 | 4/2000 |
| EP | 0 993 037 A2 | 4/2000 |
| EP | 0 836 194 B1 | 5/2000 |
| EP | 0 599 388 B1 | 8/2000 |
| EP | 0 689 252 B1 | 8/2000 |
| EP | 0 606 758 B1 | 9/2000 |
| EP | 0 682 370 B1 | 9/2000 |
| EP | 1 073 121 A2 | 1/2001 |
| EP | 0 726 601 B1 | 9/2001 |
| EP | 0 731 972 | 11/2001 |
| EP | 1 162 663 A2 | 12/2001 |
| EP | 1 162 744 A1 | 12/2001 |
| EP | 1 179 850 A2 | 2/2002 |
| EP | 1 180 799 | 2/2002 |
| EP | 1 191 596 A2 | 3/2002 |
| EP | 1 204 146 A1 | 5/2002 |
| EP | 1 204 147 A1 | 5/2002 |
| EP | 1 209 747 A2 | 5/2002 |
| EP | 0 744 722 B1 | 8/2002 |
| EP | 1 233 454 A2 | 8/2002 |
| EP | 0 725 402 B1 | 9/2002 |
| EP | 1 237 193 | 9/2002 |
| EP | 1 241 708 A2 | 9/2002 |
| EP | 1 253 634 A2 | 10/2002 |
| EP | 0 844 671 B1 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | 62-272561 | 11/1987 |
| JP | 02-294076 | 2/1991 |
| JP | 3-171768 | 7/1991 |
| JP | 8-213624 | 8/1996 |
| JP | 8-274277 | 10/1996 |
| JP | 9-046688 | 2/1997 |
| JP | 9-82912 | 3/1997 |
| JP | 10-242470 | 9/1998 |
| JP | 11-87649 | 3/1999 |
| JP | 2000-247735 | 8/2000 |
| JP | 2000-274221 | 9/2000 |
| JP | 2000-389106 | 12/2000 |
| JP | 2001-180633 | 6/2001 |
| JP | 2002-009081 | 1/2002 |
| JP | 2002-94027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-31693 | 1/2003 |
| JP | 2003-86712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |

OTHER PUBLICATIONS

"A Capacitorless Double–Gate DRAM Cell", Kuo et al., IEEE Electron Device Letters, vol. 23, No. 6, Jun. 2002, pp. 345–347.

"A Capacitorless Double–Gate DRAM Cell for High Density Applications", Kuo et al., IEEE IEDM, 2002, pp. 843–946.

"The Multi–Stable Behaviour of SOI–NMOS Transistors at Low Temperatures", Tack et al., Proc. 1988 SOS/SOI Technology Workshop (Sea Palms Resort, St. Simons Island, GA, Oct. 1988), p. 78.

"The Multistable Charge–Controlled Memory Effect in SOI MOS Transistors at Low Temperatures", Tack et al., IEEE Transactions on Electron Devices, vol. 37, No. 5, May 1990, pp. 1373–1382.

"Mechanisums of Charge Modulation in the Floating Body of Triple–Well nMOSFET Capacitor–less DRAMs", Villaret et al., Proceedings of the INFOS 2003, Insulting Films on Semiconductors, 13th Bi–annual Conference, Jun. 18–20, 2003, Barcelona (Spain), (4 pages).

"A Memory Using One–Transistor Gain Cell on SOI (FBC) with Performance Suitable for Embedded DRAM's", Ohsawa et al., 2003 Symposium on VLSI Circuits Digest of Technical Papers, Jun. 2003 (4 pages).

FBC (Floating Body Cell) for Embedded DRAM on SOI, Inoh et al., 2003 Symposium on VLSI Circuits Digest of Technical Papers, Jun. 2003 (2 pages).

"Toshiba's DRAM Cell Piggybacks on SOI Wafer", Y. Hara, EE Times, Jun. 2003.

"Memory Design Using a One–Transistor Gain Cell on SOI", Ohsawa et al., IEEE Journal of Solid–State Circuits, vol. 37, No. 11, Nov. 2002, pp. 1510–1522.

"Opposite Side Floating Gate SOI FLASH Memory Cell", Lin et al., IEEE, Mar. 2000, pp. 12–15.

"Advanced TFT SRAM Cell Technology Using a Phase–Shift Lithography", Yamanaka et al., IEEE Transactions on Electron Devices, vol. 42, No. 7, Jul. 1995, pp. 1305–1313.

"Soft–Error Characteristics in Bipolar Memory Cells with Small Critical Charge", Idei et al., IEEE Transactions on Electron Devices, vol. 38, No. 11, Nov. 1991, pp. 2465–2471.

"An SOI 4 Transistors Self–Refresh Ultra–Low–Voltage Memory Cell", Thomas et al., IEEE, Mar. 2003, pp. 401–404.

"Design of a SOI Memory Cell", Stanojevic et al., IEEE Proc. 21$^{st}$ International Conference on Microelectronics (MIEL '97), vol. 1, NIS, Yugoslavis, Sep. 14–17, 1997, pp. 297–300.

"Effects of Floating Body on Double Polysilicon Partially Depleted SOI Nonvolatile Memory Cell", Chan et al., IEEE Electron Device Letters, vol. 24, No. 2, Feb. 2003, pp. 75–77.

"MOSFET Design Simplifies DRAM", P. Fazan, EE Times, May 14, 2002 (3 pages).

"One of Application of SOI Memory Cell—Memory Array", Lončar et al., IEEE Proc. 22$^{nd}$ International Conference on Microelectronics (MIEL 2000), vol. 2, NIŠ, Serbia, May 14–17, 2000, pp. 455–458.

"A SOI Current Memory for Analog Signal Processing at High Temperature", Portmann et al., 1999 IEEE International SOI Conference, Oct. 1999, pp. 18–19.

"Chip Level Reliability on SOI Embedded Memory", Kim et al., Proceedings 1998 IEEE International SOI Conference, Oct. 1998, pp. 135–139.

"Analysis of Floating–Body–Induced Leakage Current in 0.15μ m SOI DRAM", Terauchi et al., Proceedings 1996 IEEE International SOI Conference, Oct. 1996, pp. 138–139.
"Programming and Erase with Floating–Body for High Density Low Voltage Flash EEPROM Fabricated on SOI Wafers", Chi et al., Proceedings 1995 IEEE International SOI Conference, Oct. 1995, pp. 129–130.
"Measurement of Transient Effects in SOI DRAM/SRAM Access Transistors", A. Wei, IEEE Electron Device Letters, vol. 17, No. 5, May 1996, pp. 193–195.
"In–Depth Analysis of Opposite Channel Based Charge Injection in SOI MOSFETs and Related Defect Creation and Annihilation", Sinha et al., Elsevier Science, Microelectronic Engineering 28, 1995, pp. 383–386.
"Dynamic Effects in SOI MOSFET's", Giffard et al., IEEE, 1991, pp. 160–161.
"A Simple 1–Transistor Capacitor–Less Memory Cell for High Performance Embedded DRAMs", Fazan et al., IEEE 2002 Custom Integrated Circuits Conference, Jun. 2002, pp. 99–102.
"A Novel Pattern Transfer Process for Bonded SOI Giga–bit DRAMs", Lee et al., Proceedings 1996 IEEE International SOI Conference, Oct. 1996, pp. 114–115.
"An Experimental 2–bit/Cell Storage DRAM for Macrocell or Memory–on–Logic Application", Furuyama et al., IEEE Journal of Solid–State Circuits, vol. 24, No. 2, Apr. 1989, pp. 388–393.
"High–Performance Embedded SOI DRAM Architecture for the Low–Power Supply", Yamauchi et al., IEEE Journal of Solid–State Circuits, vol. 35, No. 8, Aug. 2000, pp. 1169–1178.
"An SOI–DRAM with Wide Operating Voltage Range by CMOS/SIMOX Technology", Suma et al., 1994 IEEE International Solid–State Circuits Conference, pp. 138–139.
"A Capacitorless DRAM Cell on SOI Substrate", Wann et al., IEEE IEDM, 1993, pp. 635–638.
"The Multistable Charge Controlled Memory Effect in SOI Transistors at Low Temperatures", Tack et al., IEEE Workshop on Low Temperature Electronics, Aug. 7–8, 1989, University of Vermont, Burlington, pp. 137–141.
"High–Endurance Ultra–Thin Tunnel Oxide in MONOS Device Structure for Dynamic Memory Application", Wann et al., IEEE Electron Device Letters, vol. 16, No. 11, Nov. 1995, pp. 491–493.
"Hot–Carrier Effects in Thin–Film Fully Depleted SOI MOSFET's", Ma et al., IEEE Electron Device Letters, vol. 15, No. 6, Jun. 1994, pp. 218–220.
"Design Analysis of Thin–Body Silicide Source/Drain Devices", 2001 IEEE International SOI Conference, Oct. 2001, pp. 21–22.
"SOI MOSFET on Low Cost SPIMOX Substrate", Iyer et al., IEEE IEDM, Sep. 1998, pp. 1001–1004.
"Simulation of Floating Body Effect in SOI Circuits Using BSIM3SOI", Tu et al., Proceedings of Technical Papers (IEEE Cat No. 97th 8303), pp. 339–342.
"High–Field Transport on Inversion–Layer Electrons and Holes Including Velocity Overshoot", Assaderaghi et al., IEEE Transactions on Electron Devices, vol. 44, No. 4, Apr. 1997, pp. 664–671.
"Dynamic Threshold–Voltage MOSFET (DTMOS) for Ultra–Low Voltage VLSI", Assaderaghi et al., IEEE Transactions on Electron Devices, vol. 44, No. 3, Mar. 1997, pp. 414–422.

"Hot–Carrier–Induced Degradation in Ultra–Thin–Film Fully–Depleted SOI MOSFETs", Yu et al., Solid–State Electronics, vol. 39, No. 12, 1996, pp. 1791–1794.
Hot–Carrier Effect in Ultra–Thin–Film (UTF) Fully–Depleted SOI MOSFET's, Yu et al., 54th Annual Device Research Conference Digest (Cat. No. 96[TH]8193, pp. 22–23.
"SOI MOSFET Design for All–Dimensional Scaling with Short Channel, Narrow Width and Ultra–thin Films", Chan et al., IEEE IEDM, 1995, pp. 631–634.
"A Novel Silicon–On–Insulator (SOI) MOSFET for Ultra Low Voltage Operation", Assaderaghi et al., 1994 IEEE Symposium on Low Power Electronics, pp. 58–59.
"Interface Characterization of Fully–Depleted SOI MOSFET by a Subthreshold I–V Method", Yu et al., Proceedings 1994 IEEE International SOI Conference, Oct. 1994, pp. 63–64.
"A Capacitorless Double–Gate DRAM Cell Design for High Density Applications", Kuo et al., IEEE IEDM, Feb. 2002, pp. 843–846.
"A Dynamic Threshold Voltage MOSFET (DTMOS) for Ultra–Low Voltage Operation", Assaderaghi et al., IEEE Electron Device Letters, vol. 15, No. 12, Dec. 1994, pp. 510–512.
"A Capacitorless DRAM Cell on SOI Substrate", Wann et al., IEEE IEDM 1993, pp. 635–638.
"Studying the Impact of Gate Tunneling on Dynamic Behaviors of Partially–Depleted SOI CMOS Using BSIMPD", Su et al., IEEE Proceedings of the International Symposium on Quality Electronic Design (ISQED '02), Apr. 2002 (5 pages).
"Characterization of Front and Back Si–$SiO_2$ Interfaces in Thick– and Thin–Film Silicon–on–Insulator MOS Structures by the Charge–Pumping Technique", Wouters et al., IEEE Transactions on Electron Devices, vol. 36, No. 9, Sep. 1989, pp. 1746–1750.
"An Analytical Model for the Misis Structure in SOI MOS Devices", Tack et al., Solid–State Electronics vol. 33, No. 3, 1990, pp. 357–364.
"A Long Data Retention SOI DRAM with the Body Refresh Function", Tomishima et al., IEICE Trans. Electron., vol. E80–C, No. 7, Jul. 1997, pp. 899–904.
"Capacitor–Less 1–Transistor DRAM", Fazan et al., 2002 IEEE International SOI Conference, Oct. 2002, pp. 10–13.
"SOI (Silicon–on–Insulator) for High Speed Ultra Large Scale Integration", C. Hu, Jpn. J. Appl. Phys. vol. 33 (1994) pp. 365–369, Part 1, No. 1B, Jan. 1994.
"Source–Bias Dependent Charge Accumulation in P+ –Poly Gate SOI Dynamic Random Access Memory Cell Transistors", Sim et al., Jpn. J. Appl. Phys. vol. 37 (1998) pp. 1260–1263, Part 1, No. 3B, Mar. 1998.
"Suppression of Parasitic Bipolar Action in Ultra–ThinFilm Fully–Depleted CMOS/SIMOX Devices by Ar–Ion Implantation into Source/Drain Regions", Ohno et al., IEEE Transactions on Electron Devices, vol. 45, No. 5, May 1998, pp. 1071–1076.
"Fully Isolated Lateral Bipolar–MOS Transistors Fabricated in Zone–Melting–Recrystallized Si Films on $SiO_2$,", Tsaur et al., IEEE Electron Device Letters, vol. EDL–4, No. 8, Aug. 1983, pp. 269–271.
"Silicon–On–Insulator Bipolar Transistors", Rodder et al., IEEE Electron Device Letters, vol. EDL–4, No. 6, Jun. 1983, pp. 193–195.

"Characteristics and Three–Dimensional Integration of MOSFET's in Small–Grain LPCVD Polycrystalline Silicon", Malhi et al., IEEE Transactions on Electron Devices, vol. ED–32, No. 2, Feb. 1985, pp. 258–281.

"Triple–Wel nMOSFET Evaluated as a Capacitor–Less DRAM Cell for Nanoscale Low–Cost & High Density Applications", Villaret et al., Handout at Proceedings of 2003 Silicon Nanoelectronics Workshop, Jun. 8–9, 2003, Kyoto, Japan (2 pages).

"Mechanisms of Charge Modulation in the Floating Body of Triple–Well NMOSFET Capacitor–less DRAMs", Villaret et al., Handout at Proceedings of INFOS 2003, Jun. 18–20, 2003, Barcelona, Spain (2 pages).

"Embedded DRAM Process Technology", M. Yamawaki, Proceedings of the Symposium on Semiconductors and Integrated Circuits Technology, 1998, vol. 55, pp. 38–43.

"3–Dimensional Simulation of Turn–off Current in Partially Depleted SOI MOSFETs", Ikeda et al., IEIC Technical Report, Institute of Electronics, Information and Communication Engineers, 1998, vol. 97, No. 557 (SDM97 186–198), pp. 27–34.

"DRAM Design Using the Taper–Isolated Dynamic RAM Cell, Leiss et al.", IEEE Transactions on Electron Devices, vol. ED–29, No. 4, Apr. 1982, pp. 707–714.

* cited by examiner

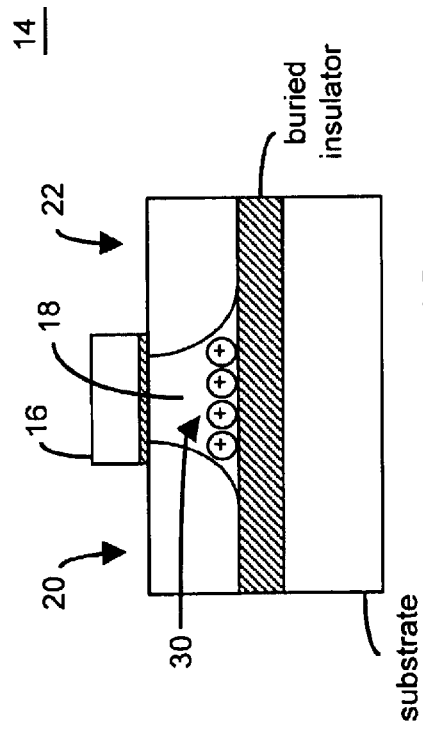
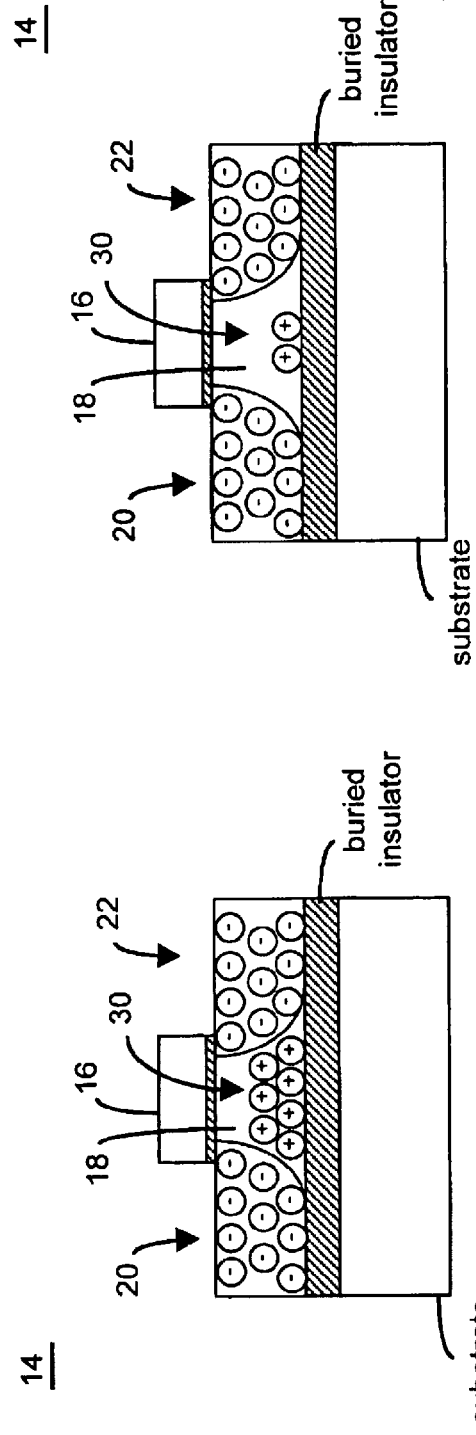

REFERENCE CURRENT GENERATOR, AND METHOD OF PROGRAMMING, ADJUSTING AND/OR OPERATING SAME

CROSS-REFERENCE TO RELATED APPLICATIONS

This application claims priority to: (1) U.S. Provisional Application Ser. No. 60/470,276, entitled "Method and Apparatus for Generating a Reference Current in a Semiconductor Memory Device", filed May 14, 2003; and (2) U.S. Provisional Application Ser. No. 60/470,462, entitled "An Offset Cancellation Technique—for SOI Capacitor-less 1T DRAM", filed May 13, 2003 (hereinafter collectively "the Provisional Application"). The contents of the Provisional Applications are incorporated by reference herein in their entirety.

BACKGROUND

This invention relates to a semiconductor memory device having a plurality of semiconductor memory cells, and techniques for semiconductor memory cells; and more particularly, in one aspect, to techniques and circuitry for reading data that is stored in memory cells including techniques and circuitry for generating a reference current which is used to read data that is stored in memory cells, of a semiconductor dynamic random access memory ("DRAM") device, wherein, for example, the memory cells have an electrically floating body in which an electrical charge is stored.

There are many different types and/or forms of DRAM cells, including, for example, a semiconductor memory cell consisting of an access transistor and a capacitor, which stores an electric charge representing a bi-stable memory state. The binary logic state stored in the capacitor of each cell is determined by comparing an output voltage of the memory cell with a reference voltage (for example, $V_{dd}/2$). The access transistor serves as a switch for controlling the charging and discharging of the capacitor as well as reading and writing of the logic states into the capacitor (i.e., charging or discharging the capacitor). (See, for example, U.S. Pat. No. 6,717,835).

Another type of dynamic random access memory cell is described and illustrated in non-provisional patent application entitled "Semiconductor Memory Device", which was filed on Jun. 10, 2003, and assigned Ser. No. 10/450,238 (hereinafter "Semiconductor Memory Device Patent Application"). With reference to FIGS. 1A and 1B, the Semiconductor Memory Device Patent Application discloses, among other things, semiconductor memory device 10 in which each memory cell 12 consists of transistor 14 having gate 16, body region 18, which is electrically floating, source region 20 and drain region 22. The body region 18 is disposed between and adjacent to source region 20 and drain region 22. Data is written into or read from a selected memory cell by applying suitable control signals to a selected word line(s) 24, a selected source line(s) 26 and/or a selected bit line(s) 28. In response, charge carriers are accumulated in or emitted and/or ejected from electrically floating body region 18 wherein the data states are defined by the amount of carriers within electrically floating body region 18. Notably, the entire contents of the Semiconductor Memory Device Patent Application, including, for example, the features, attributes, architectures, configurations, materials, techniques and advantages described and illustrated therein, are incorporated by reference herein.

In particular, in one embodiment, the memory cell of the Semiconductor Memory Device Patent Application operates by accumulating in or emitting/ejecting majority carriers (electrons or holes) 30 from body region 18 of, for example, N-channel transistors. (See, FIGS. 2A and 2B). In this regard, accumulating majority carriers (in this example, "holes") 30 in body region 18 of memory cells 12 via, for example, impact ionization near source region 20 and/or drain region 22, is representative of a logic high or "1" data state. (See, FIG. 2A). Emitting or ejecting majority carriers 30 from body region 18 via, for example, forward biasing the source/body junction and/or the drain/body junction, is representative of a logic low data state ("0 or A0"). (See, FIG. 2B).

Several techniques may be implemented to read the data stored in (or write the data into) the memory cell. For example, a current sense amplifier may be employed to read the data stored in memory cells. In this regard, a current sense amplifier may compare the cell current to a reference current, for example, the current of a reference cell. From that comparison, it may be determined whether memory cell contained a logic high data state (relatively more majority carriers contained within body region) or logic low data state (relatively less majority carriers contained within body region). The differences of the charge stored in the body of the transistor affects the threshold voltage of the transistor, which in turn affects the current conducted by the transistor when switched into its conductive state.

In particular, with reference to FIG. 3, sense amplifier 32 (for example, a cross-coupled sense amplifier) compares the current conducted by transistor 14 of memory cell 12 with a reference current generated by reference current generator 34. The magnitude of the reference current generally lies between the magnitudes of the currents conducted in the logic high data state and logic low data state of memory cell 12. The sense amplifier 32 compares the reference current to the current produced by memory cell 12 (the current varies depending on whether memory cell 12 is either in a logic high data state or logic low data state). Based on that comparison, sense amplifier 32 generates or outputs an output signal (on output 36) having a positive or negative polarity, depending upon whether memory cell 12 stored a logic high or logic low binary data state.

With reference to FIG. 4, a conventional reference current generator includes transistor 38, which stores a logic high data state, and transistor 40, which stores a logic low data state. The reference current generator 34 also includes switches 44 (comprised of, for example, transistors) which selectively connect transistors 38 and 40 to node 42. In addition, switches 44 may selectively isolate transistors 38 and 40 to enable data states to be written into transistors 38 and 40. During a read operation, switches 44 are closed to connect transistors 38 and 40 to node 42.

With continued reference to FIG. 4, reference current generator 34 further includes cascade current source 46 which includes PMOS transistor 48 having its gate connected to its source, in series with NMOS transistor 50, the source of which is connected to node 42. The gate bias voltage of NMOS transistor 50 is controlled by connecting node 42 to the inverting input of operational amplifier 52. The output of operational amplifier 52 is connected to the gate of NMOS transistor 50. The non-inverting input of operational amplifier 52 is supplied with a reference voltage ($V_{BLR}$).

The total current passing through node 42 (ignoring the negligible input current of operational amplifier 52) may be characterized as the sum of the currents passing through transistors 38 and 40, (i.e., the sum of the currents conducted by transistors 38 and 40 having a logic high data state and a logic low data state, respectively). In operation, the current passing through node 42 adjusts the voltage of node 42, which in turn adjusts the gate-source voltage of NMOS transistor 50 until the current ($2I_{ref}$) supplied by cascade current source 46 equals to the sum of the currents flowing through transistors 38 and 40.

Conventional reference current generators (for example, reference current generator 34 of FIGS. 3 and 4) tend to "track" changing characteristics of memory cell 12, for example, changes induced by temperature variations and/or aging of the transistors, in a relatively slow manner. In addition, reference current generator 34 often has a high noise correlation with memory cell 12. In this regard, rapid voltage changes (for example, voltage spikes) on the gate, drain, source or silicon on insulator back gate voltage of memory cell 12 will also be imposed or replicated on transistors 38 and 40. As such, the difference between the current of memory cell 12 and the reference current tend to remain largely unchanged.

However, the reference current generator configuration of FIGS. 3 and 4 suffers from a drawback that the charge state of transistors 38 and 40 decays over time. (See, FIG. 5). As a result, the magnitude of the reference current also changes overtime (for example, decays over time). In this regard, the reference current varies throughout its refreshing cycle between a value "Ref$_1$" at the beginning of a refreshing cycle, and "Ref$_2$" at the end of the cycle. Accordingly, the charge states of transistors 38 and 40 must be periodically refreshed. Notably, transistors 38 and 40 should be refreshed at least as often as that of memory cell 12 in order to ensure proper operation.

In addition, such a conventional configuration also suffers from the disadvantage that the transistors 38 and 40 may often be at a different stage of refresh cycles relative to memory cell 12. This is particularly disadvantageous in the case illustrated in FIG. 5, in which reference transistors 38 and 40 are newly or recently refreshed (i.e., references near the beginning of the cycle, indicated in FIG. 5 as 54) and transistor 14 of memory cell 12 is near the end of its cycle prior to refreshing. Under this circumstance, when transistor 40 provides a current (representative of a decayed data state) that is equal to the reference current (indicated in FIG. 5 as 56), sense amplifier 32 may have difficulty, or may no longer be capable of, distinguishing between logic low data state and a logic high data state. In this way, a data reading uncertainty arises.

Notably, in sense amplifier 32 of the conventional-type, offset currents and/or voltages may arise because of transistor mismatch. Furthermore, the parasitic capacitances of the interconnection traces or wires as well as the storage cells themselves may neither be perfectly matched. These effects limit the accuracy with which the magnitude of the reference signal can be chosen between the magnitude of the signals representing the logic high data state and the logic low data states. This is particularly problematic in integrated memory devices of very small transistor size, even if the memory device consists of generally identical transistors.

SUMMARY OF THE INVENTION

There are many inventions described and illustrated herein. In a first principal aspect, the present invention is a semiconductor dynamic random access memory device comprising a plurality of bit lines, including a first bit line and a second bit line, and a first digitally controlled reference current generator, selectively coupled to the first bit line, to generate a first reference current in response to a first reference current control word. The memory device also includes a plurality of memory cells, including a first memory cell coupled to the first bit line and a second memory cell coupled to the second bit line. The memory cells store a first data state and a second data state. Each memory cell includes at least one transistor including a source region, a drain region, a body region disposed between and adjacent to the source region and the drain region and a gate spaced apart from, and capacitively coupled to, the body region. The body region stores a charge such that the transistor includes a first state representative of a first charge in the body region and a second state representative of a second charge in the body region. Notably, the memory cell is in: (1) the first data state when the first transistor is in the first state and (2) the second data state when the first transistor is in the second state.

The memory device also includes a sense amplifier, having a first input coupled to the first bit line and a second input coupled to the second bit line. The sense amplifier uses the first reference current to sense whether the second memory cell is in the first data state or the second data state.

In one embodiment, the semiconductor dynamic random access memory device further includes a second digitally controlled reference current generator, selectively coupled to the second bit line, to generate a second reference current in response to a second reference current control word. The sense amplifier uses the second reference current to sense whether the first memory cell is in the first data state or the second data state.

In another embodiment, the first digitally controlled reference current generator is selectively coupled to the second bit line when the sense amplifier is sensing the data state of the first memory cell. In this regard, the sense amplifier uses the first reference current to sense whether the first memory cell is in the first data state or the second data state.

The semiconductor dynamic random access memory device may also include a control unit, coupled to the first digitally controlled reference current generator, to generate the reference current control word. The control unit may generate the reference current control word during start-up/initialization and/or during normal operation. In one embodiment, the control unit uses a successive approximation technique to determine the reference current control word. The control unit may be selectively coupled to the sense amplifier to execute the successive approximation technique that determines the reference current control word.

Notably, the control unit may be coupled to the first and second digitally controlled reference current generators to generate the first reference current control word and the second reference current control word.

In one embodiment, the second digitally controlled reference current generator generates a reference current in response to the first reference current control word. In this embodiment, the sense amplifier uses the reference current to sense whether the first memory cell is in the first data state or the second data state.

The semiconductor dynamic random access memory device may include first and second bit lines that are connected to the sense amplifier in an open bit line architecture or a folded bit line architecture.

In another aspect, the present invention is a semiconductor dynamic random access memory device comprising a plurality of memory cells arranged in a matrix of rows and columns wherein each memory cell includes at least one transistor including a source region, a drain region, a body region disposed between and adjacent to the source region and the drain region, wherein the body region is electrically floating, and a gate spaced apart from, and capacitively coupled to, the body region. The transistor includes a first state representative of a first charge in the body region and a second state representative of a second charge in the body region. The memory cell is in: (1) the first data state when the first transistor is in the first state and (2) the second data state when the first transistor is in the second state.

The semiconductor dynamic random access memory device of this aspect further includes a plurality of bit lines, including a first bit line connected to a first memory cell and a second bit line connected to a second memory cell, and a plurality of digitally controlled reference current generators. Each digitally controlled reference current generator being selectively coupled to an associated one of the bit lines to provide a reference current in response to an associated reference current control word. A plurality of sense amplifiers senses: (1) the data state of the memory cells connected to a first associated bit line using the reference current provided by a digitally controlled reference current generator connected to a second associated bit line, and (2) the data state of the memory cells connected to a second associated bit line using the reference current provided by a digitally controlled reference current generator connected to a first associated bit line.

In one embodiment of this aspect of the invention, the semiconductor dynamic random access memory device includes a control unit, coupled to the first digitally controlled reference current generator, to generate the reference current control word for each reference current generator. In one embodiment, the control unit uses a successive approximation technique to determine the reference current control word for at least one reference current generator. The control unit may be selectively coupled to the sense amplifier associated with the at least one reference current generator to execute the successive approximation technique that determines the reference current control word.

The reference current control words may be provided to the reference current generators during an initialization sequence. The reference current control words may also provided to the reference current generators during normal operation. In one embodiment, the control unit may generate the reference current control words during normal operation of the memory device, and wherein the reference current control words are provided to the reference current generators during normal operation.

The bit line layout of the semiconductor dynamic random access memory device of this aspect of the invention may include an open bit line architecture or a folded bit line architecture.

In yet another aspect, the present invention is a semiconductor dynamic random access memory device comprising a plurality of bit lines, including first and second bit lines and a sense amplifier, having a first input coupled to the first bit line and a second input coupled to the second bit line. The memory device may also include a first reference current generator, selectively coupled to the first bit line, to generate a first reference current in response to a reference current control word, and a second reference current, selectively coupled to the second bit line, to generate a second reference current in response to the reference current control word.

In addition, the memory device may also include a plurality of memory cells, including a first memory cell coupled to the first bit line and a second memory cell coupled to the second bit line, wherein the memory cells each store a first data state and a second data state. Each memory cell may include at least one transistor including a source region, a drain region, a body region disposed between and adjacent to the source region and the drain region, wherein the body region is electrically floating, and a gate spaced apart from, and capacitively coupled to, the body region. The transistor includes a first state representative of a first charge in the body region and a second state representative of a second charge in the body region. The memory cell is in: (1) the first data state when the first transistor is in the first state and (2) the second data state when the first transistor is in the second state.

In operation, the sense amplifier uses: (1) the first reference current to sense whether the second memory cell is in the first data state or the second data state, and (2) the second reference current to sense whether the first memory cell is in the first data state or the second data state.

In one embodiment, the semiconductor dynamic random access memory device includes a control unit, coupled to the first reference current generator, to adjust the first reference current generated by the first reference current generator. The control unit may employ a successive approximation technique to determine the reference current control word. Notably, the control unit may selectively couple to the sense amplifier to execute the successive approximation technique that determines the reference current control word.

In one embodiment, the first and second reference current generators are digitally controlled reference current generators. In another embodiment, the first and second reference current generators are analog reference current generators.

The control unit may generate the first reference current control word during an initialization sequence of the memory device. The control unit may also generate the first reference current control word during normal operation of the memory device.

The bit line layout of the semiconductor dynamic random access memory device of this aspect of the invention may include an open bit line architecture or a folded bit line architecture.

Again, there are many inventions described and illustrated herein. This Summary of the Invention is not exhaustive of the scope of the present invention. Moreover, this Summary is not intended to be limiting of the invention and should not be interpreted in that manner. While certain embodiments, features, attributes and advantages of the inventions have been described in this Summary, it should be understood that many others, as well as different and/or similar embodiments, features, attributes and/or advantages of the present inventions, which are apparent from the description, illustrations and claims, which follow.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

FIG. 1B illustrates a memory cell according to the Semiconductor Memory Device Patent Application;

FIGS. 2A and 2B are exemplary schematic illustrations of the charge relationship, for a particular memory state, of the floating body, source and drain regions of a memory cell according to the Semiconductor Memory Device Patent Application;

DETAILED DESCRIPTION

Figure 1A:
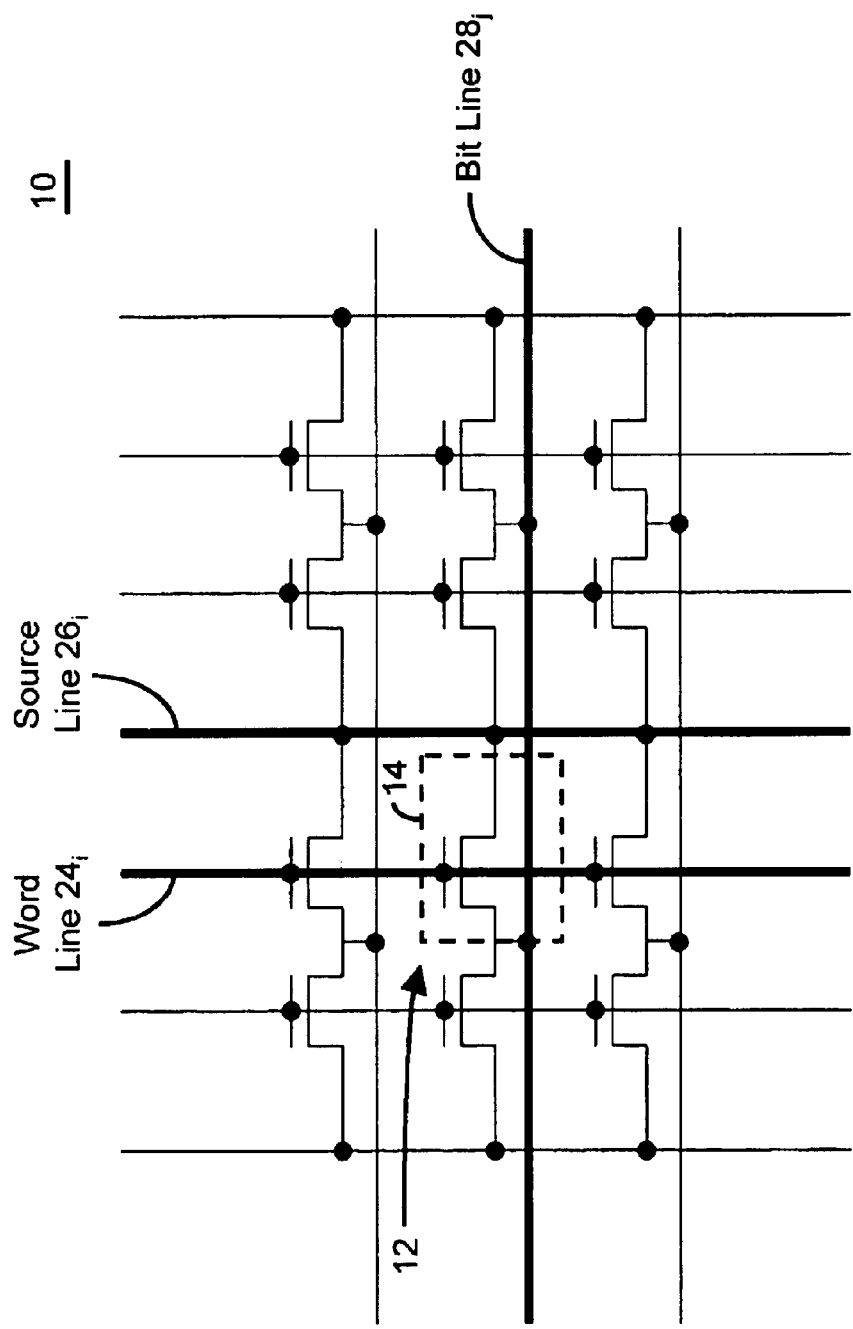
FIG. 1A is a schematic representation of a portion of a DRAM array as illustrated (and described) in the Semiconductor Memory Device Patent Application.
Figure 3:
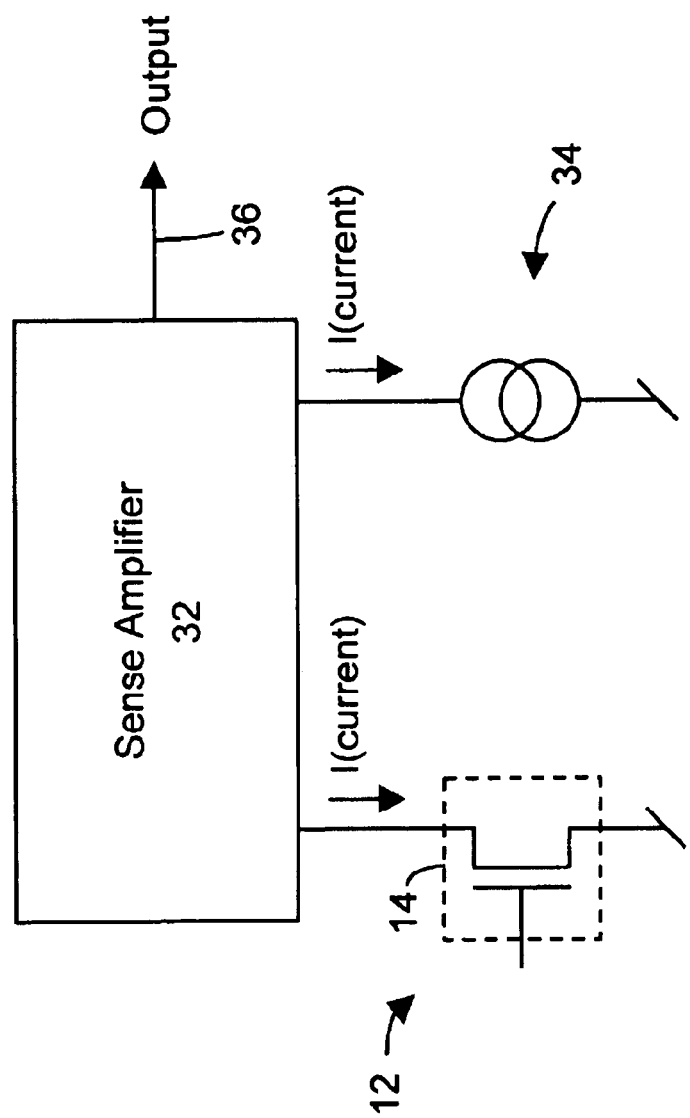
FIG. 3 is a block-diagram illustration of a conventional circuit configuration to read data from a memory cell.
Figure 4:
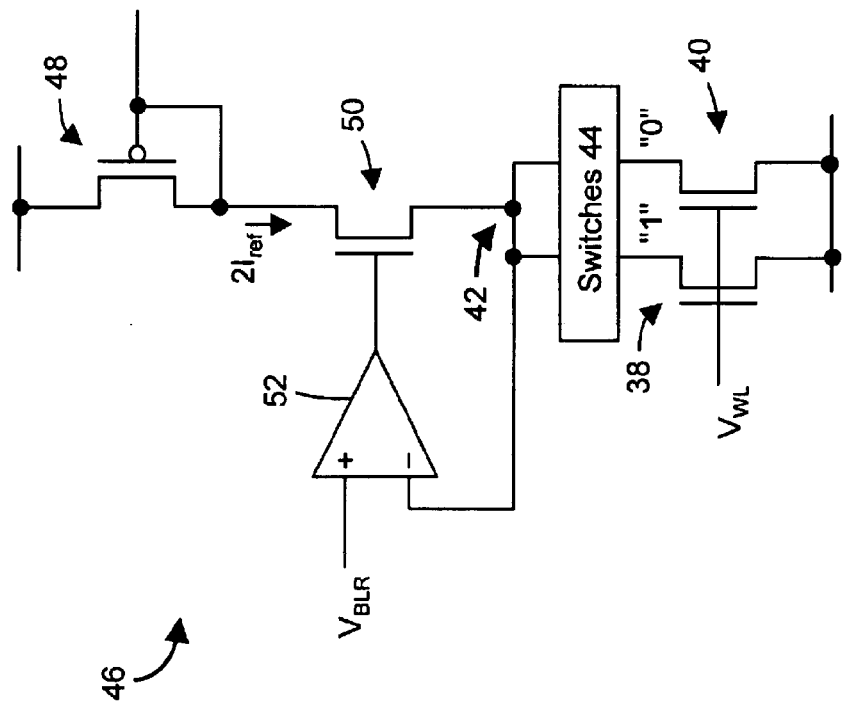
FIG. 4 is a schematic representation of a conventional reference current generating circuit, which may be implemented in the configuration of FIG. 3.
Figure 5:
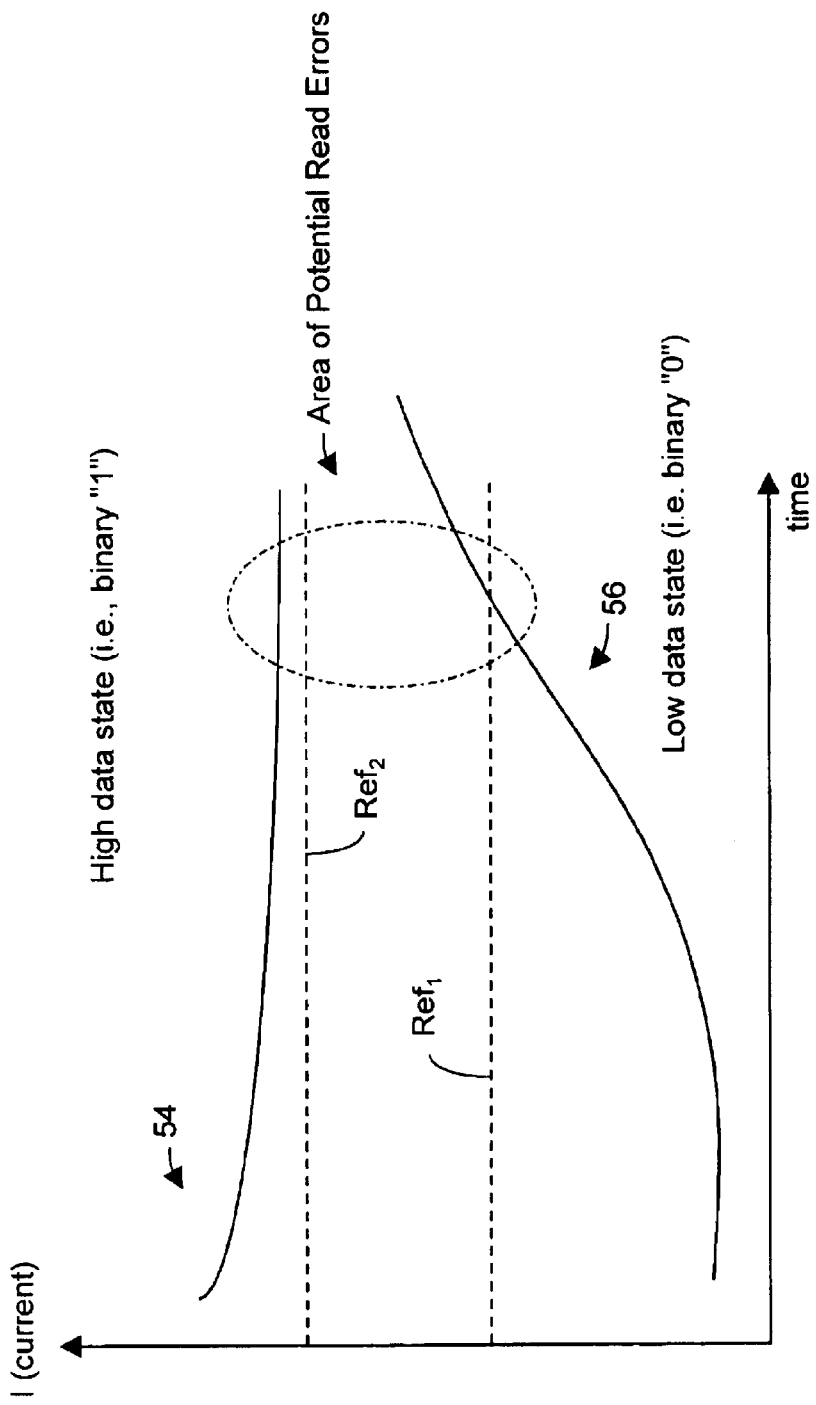
FIG. 5 is a graphical illustration of the variation of current with time of the data storage cell and reference current generator of the FIGS. 3 and 4.

There are many inventions described and illustrated herein. In a first aspect, the present invention is a technique and circuitry for reading data that is stored in memory cells. In one embodiment of this aspect, the present invention is a technique and circuitry for generating a reference current that is used, in conjunction with a sense amplifier, to read data that is stored in memory cells of a memory device (for example, a DRAM device). The technique and circuitry for generating a reference current may be implemented using an analog configuration, a digital configuration, and/or combinations of analog and digital configurations.

In one embodiment, the memory cells include one or more transistors, each having an electrically floating body in which an electrical charge is stored. In this regard, the memory cells may be comprised of one transistor which stores an electrical charge in the body region which is representative of a binary state (see, for example, FIGS. 1A, 1B, 2A and 2B). Notably, the transistor that comprises the memory cell may employ any type of design and/or control technique, whether now known or later developed, including, for example, those discussed above in the Semiconductor Memory Device Patent Application as well as those discussed in "Semiconductor Memory Device and Method of Operating Same", which was filed on May 6, 2004, by Ferrant, Okhonin, Carman and Bron, (hereinafter "Semiconductor Memory Device Patent Application II"). The entire contents of the Semiconductor Memory Device Patent Application II, including, for example, the features, attributes, architectures, configurations, materials, techniques and advantages described and illustrated therein, are incorporated by reference herein.

In another embodiment, the memory cells may be comprised of more than one transistor. For example, the memory cells may include two transistors, which are arranged and/or configured as a complementary memory cell that is read and/or determined by sampling, sensing, measuring and/or detecting the polarity of the logic states stored in each transistor of complementary memory cell. That is, the two-transistor complementary memory cell is read by sampling, sensing, measuring and/or detecting the difference in signals (current or voltage) stored in the two transistors. (See, for example, the memory cell, architectures, layouts and/or configurations described and illustrated in "Semiconductor Memory Cell, Array, Architecture and Device, and Method of Operating Same", which was filed on Apr. 22, 2004 and assigned Ser. No. 10/829,877 (hereinafter "Semiconductor Memory Cell Patent Application"). Notably, the entire contents of the Semiconductor Memory Cell Patent Application, including, for example, the features, attributes, architectures, layouts, configurations, materials, techniques and advantages described and illustrated therein, are incorporated by reference herein.

Indeed, the memory cells may be arranged and/or configured in an array, and controlled (written to, read from and/or refreshed) in many, many different ways. All such arrangements, layouts, designs and/or control techniques for the memory cells described above, whether now known or later developed, are intended to be within the present invention. For example, the memory cells may be arranged and/or configured in arrays as described in Semiconductor Memory Device Patent Application II and/or Semiconductor Memory Cell Patent Application. The memory cells may be controlled in the manner described in those patent applications. Again, the features, attributes, architectures, layouts, configurations, materials, techniques and advantages described and illustrated in Semiconductor Memory Device Patent Application II and/or Semiconductor Memory Cell Patent Application are incorporated by reference herein and may be implemented in conjunction with the inventions described in this application. For the sake of brevity, those discussions will not be repeated.

Figure 6:
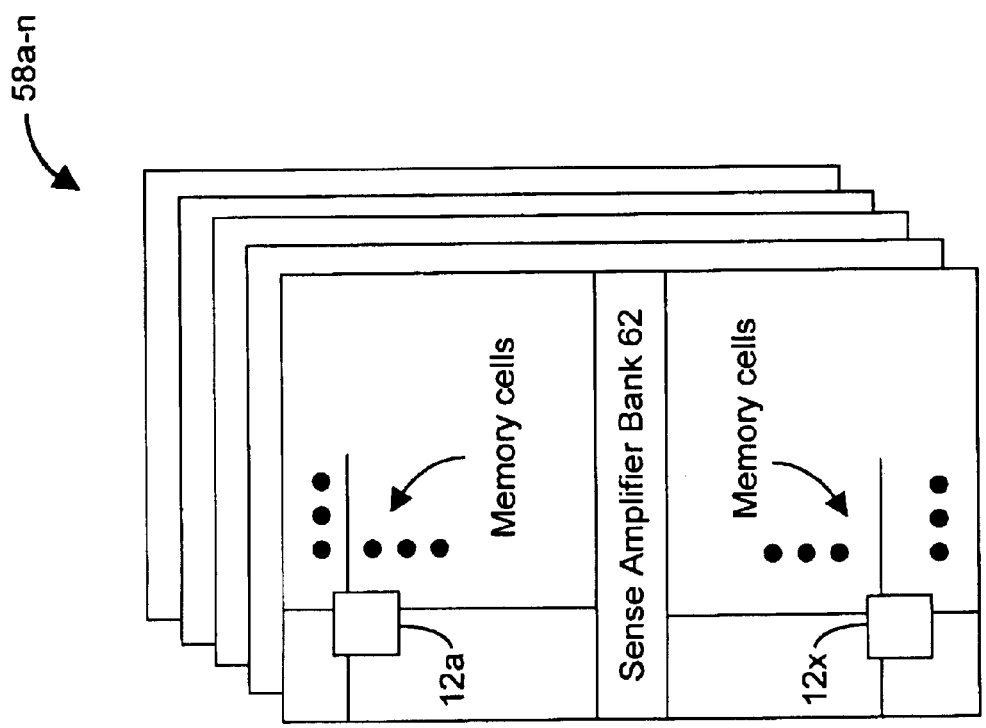
FIG. 6 is a block diagram representation of a memory device including a plurality of memory cells at the intersection of rows and columns of a plurality of memory arrays.
Figure 7:
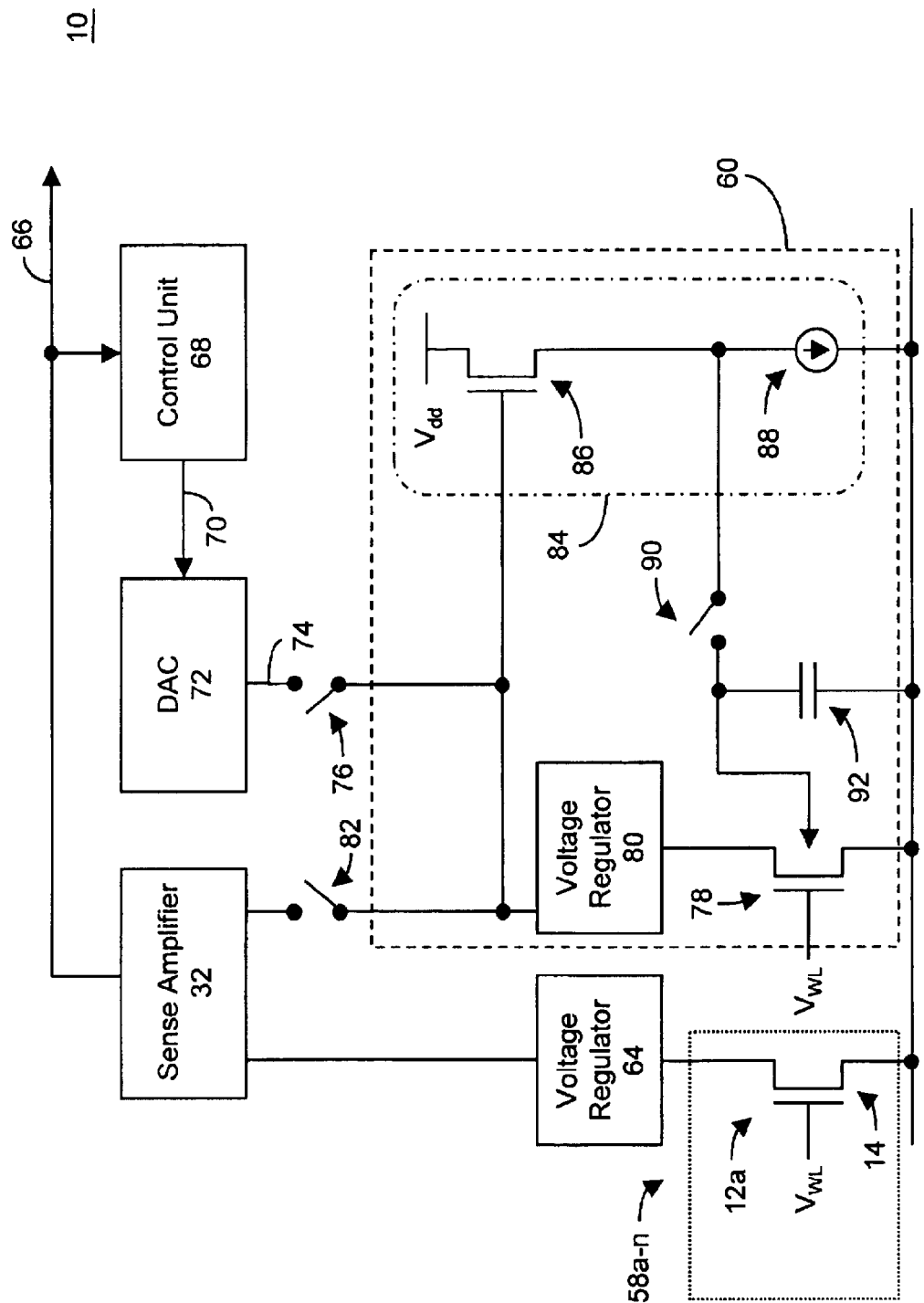
FIG. 7 is a schematic representation of a portion of a memory device, including a reference current generator and circuitry to control and/or set the reference current generator, in accordance with a first aspect of the present invention.

With reference to FIGS. 1A, 6 and 7, memory device 10 includes one or more memory arrays 58a–n of memory cells 12a–x (for example, one or more partially depleted SOI (PD SOI) type transistors 14 forming individual memory cells 12). The transistor(s) 14 of memory cell 12 may be a symmetrical or non-symmetrical device(s). Where transistor(s) 14 is/are symmetrical, the source and drain regions are essentially interchangeable. However, where transistor(s) 14 is/are non-symmetrical device(s), the source or drain regions of transistor(s) 14 have different electrical, physical, doping concentration and/or doping profile characteristics. As such, the source or drain regions of a non-symmetrical device are typically not interchangeable.

In one embodiment, memory device 10 determines the binary logic state stored in a given memory cell 12 using reference current generator 60 and sense amplifier 32 (for example, a cross-coupled sense amplifier as illustrated in FIG. 14), which is one of a plurality of sense amplifier of sense amplifier bank 62. In particular, in one embodiment, the binary logic state of data stored by memory cell 12a (one of the plurality of memory cells contained in memory array 58a–n) is sensed by coupling memory cell 12a to sense amplifier 32 via, for example, voltage regulator 64. The sense amplifier 32 receives the current conducted by memory cell 12a and compares that current to a reference current generated by reference current generator 60. In response, sense amplifier 32 generates one or more output signals (for example, on output signal line 66) that is/are representative of the data stored in the memory cell 12a. That is, the output of sense amplifier 32 will be either high or low (for example, positive or negative) depending upon the charge state of memory cell 12.

The magnitude of the reference current produced by reference current generator 60 is generally between (i) the magnitude of the current conducted by memory cells 12 when storing a logic high data state and (ii) the magnitude of the current conducted by memory cells 12 when storing a logic low data state. The circuitry and techniques for controlling reference current generator 60 employ the output (s) of sense amplifier 32 to control, calibrate and/or set the magnitude of the reference current produced by reference current generator 60. In this regard, the output(s) of sense amplifier 32 are input to control unit 68, which outputs control signal 70 to reference current generator 60. Notably, control signal 70 may consist of a plurality of bits (the reference current control word) that are converted to an analog representation (signal 74), via digital-to-analog converter (DAC) 72, and selectively applied to reference current generator 60 using switch 76 (for example, a transistor).

The reference current generator 60 includes transistor 78 connected via voltage regulator 80 and switch 82 (for example, a transistor) to sense amplifier 32. The reference current generator 60 may also include level shifter 84 to control the operating and/or responsive characteristics of transistor 78. The level shifter 84 includes transistor 86 connected in series with current source 88. The gate of transistor 86 is connected to sense amplifier 32 via switch 82, and to DAC 72 via switch 76. The source of transistor 86 is connected to the body of transistor 78 via switch 90 (for example, a transistor). The capacitor 92 is connected between the body and source of transistor 78 to hold any voltage signal applied by transistor 86 via switch 90.

Figure 8:
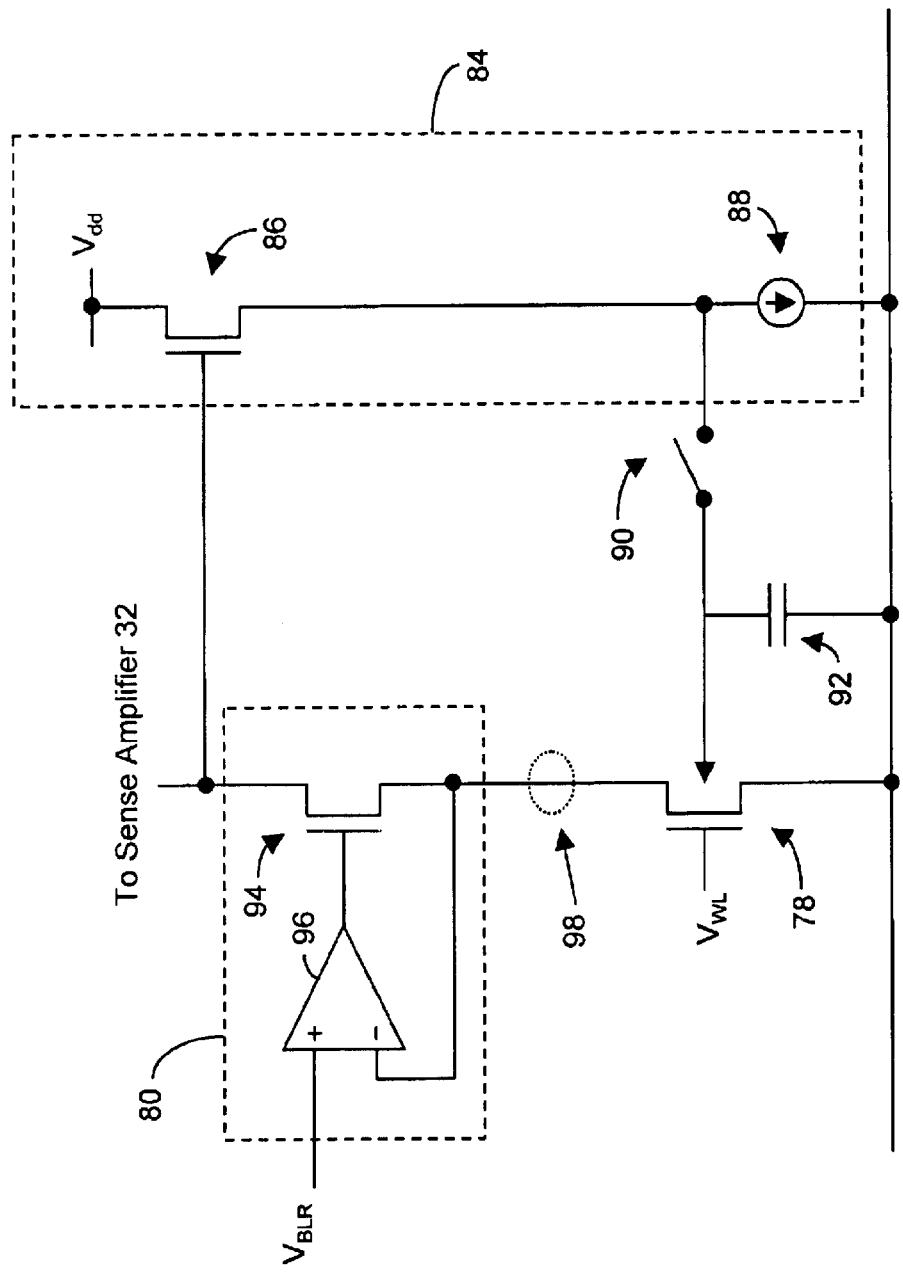
FIGS. 8–10 are schematic representations of several embodiments of a reference current generator that are suitable for use in the portion of a memory device illustrated in FIG. 7.

With reference to FIG. 8, reference current generator 60 is shown in more detail. The voltage regulator 80, in one embodiment, may be comprised of transistor 94 and operational amplifier 96 (for example, a voltage-to-voltage amplifier or voltage-to-current amplifier). The source of transistor 94, in this embodiment, is connected to the drain of transistor 78. Further, the gate of transistor 94 is connected to the output of operational amplifier 96. A reference voltage $V_{BLR}$ is applied to the non-inverting input of operational amplifier 96, and the inverting input is connected to the junction of the source of transistor 94 and the drain of transistor 78.

With reference to FIGS. 5–8, in operation, transistor 78, when switched into its conductive state by a word line voltage $V_{WL}$ applied to its gate, such that the gate-source voltage of transistor 78 exceeds the threshold voltage, conducts a drain current determined by the difference between gate voltage $V_{WL}$ and the threshold voltage of transistor 78. Current is supplied to the channel of transistor 78 by transistor 94, and the voltage at point 98 at the junction of the source of transistor 94 and the drain of transistor 78 settles at a value at which transistor 94, controlled by operational amplifier 96, conducts a current appropriate to the data state of transistor 78.

The switch 90 is open during normal operation and is closed at, for example, regular and/or periodic intervals. When switch 90 is closed, the voltage at the source of transistor 86 charges capacitor 92 and is applied to the substrate of transistor 78. In this way, the threshold voltage of transistor 78 changes (due to the charging of the substrate of transistor 78), and the current conducted by transistor 78 for a given gate to source voltage also changes.

As the charge in the body of transistor 78 decays with time, the high data state current decreases slightly, and the low data state current increases to a greater extent than the high data state current. As the current conducted by transistor 78 (and therefore the current conducted by transistor 94) increases, the voltage at the drain of transistor 94 increases, as a result of which the source voltage of transistor 86 is also caused to increase. This increases the voltage at the substrate of transistor 78, as a result of which the threshold voltage of transistor 78 increases. By increasing the threshold voltage of transistor 78, the drain current of transistor 78 decreases, as a result of which the reference current generated by transistor 78 is maintained generally constant despite decay, over time, of the current provided or sunk by transistor 78.

The value of the reference current may be set by applying a high data state to all of memory cells 12, and reading the output of one or more memory cells 12. Under these conditions, switch 76 is closed, and control unit 68 (via signal 70) iteratively or repeatedly adjusts the value of reference current provided by reference current generator 60. In one embodiment, the reference current is iteratively or repeatedly adjusted and/or set to a value that is slightly lower than the lowest value of the high data state current for memory cells 12. The control unit 68 implements a reference current algorithm to control and/or set the reference current output by reference current generator 60.

Briefly, the reference current adjustment algorithm, in certain embodiments of the present invention, adjustments, compensates and/or sets the reference current to a value that provides an optimum, enhanced and/or predetermined read window (via optimum, enhanced and/or predetermined values of the reference current output by reference current generator 60). The reference current adjustment algorithm may implement an iterative process to determine the optimum, enhanced and/or predetermined read window. That is, the "initial" or existing reference current output by reference current generator 60 may be applied, and control unit 68 may determine the output of sense amplifier 32 in view of a known (predetermined) state of memory cell 12. In response to that determination, the reference current may be adjusted based on the result from sense amplifier 32 (i.e., is the reference current or the sensing operation within, above or below a desired, selected and/or predetermined range of results).

Thereafter, control unit 68 may again set reference current generator 60 to provide a slightly increased or decreased reference current. After sensing the known (predetermined) state of memory cell 12 via sense amplifier 32, additional adjustment and/or compensation of the output of reference current generator 60 may be implemented, via control unit 68, as required in view of the result from sense amplifier 32 (i.e., is the reference current or the sensing operation within, above or below a desired, selected and/or predetermined range of results). Based on that determination, the process is either repeated or terminated.

The iterative process may be implemented in a "degrading" manner or "improving" manner. That is, the initial or existing reference current output by reference current generator 60 may be initially configured outside the acceptable limits and incrementally improved until within the acceptable limit (i.e., a limit that provides a correct sense operation which may or may not include a margin). Alternatively, or in addition, the "initial" or existing reference current output by reference current generator 60 may be initially configured within the acceptable limits (i.e., a limit that provides a correct sense operation which may or may not include a margin) and incrementally degraded until outside the acceptable limit. In this way, control unit 68 may then set and/or configure reference current generator 60 to provide an appropriate reference current.

Thereafter, switch 76 may be opened (and the programming and/or control of reference current generator 60 terminated) and memory cells 12 may be programmed with data of unknown, desired, predetermined and/or selected states. The data state of memory cells 12 may be read by comparing the current conducted by a given memory cell 12a with the reference current (generated by reference current generator 60) in sense amplifier 32 and the result output as output signals on signal line(s) 66.

The performance of the sensing operation (for example, the performance of the circuitry of FIG. 7) may be measured, determined, inspected, characterized and/or evaluated, intermittently, periodically, during device initialization, re-initialization and/or at start-up or power-up, and/or in situ (for example, during device evaluation/inspection/test, during device initialization, re-initialization and/or at start-up or power-up). In this way, the performance of memory device 10 may be periodically and/or intermittently measured, inspected, characterized, determined and/or evaluated to, for example, (1) ensure that the reference current generator and/or the sensing operation is/are operating properly, and/or (2) ensure that the reference current generator and/or the sensing operation is/are within acceptable operating parameters.

The control unit 68 may implement the setting, calibration and/or tuning techniques for one, some or all of reference current generators 60 within memory device 10. In this regard, the control signal provided to DAC 72 may be determined for one, some or all of reference current generators 60 and, as such, control unit 68 programs or re-programs one, some or all reference current generators 60. The control unit 68 may set, calibrate and/or tune one, some or all of reference current generators 60 as described immediately above. In those embodiments where a plurality of reference current generators 60 are set, calibrated and/or tuned, switch 76 may be a multiplexer having an input coupled to DAC 72 and a plurality of outputs, each coupled to one or more reference current generators 60.

In addition, the reference current provided by reference current generators 60 may be periodically and/or intermittently "refreshed" in order to provide an enhanced, optimum, desired, predetermined and/or "minimum" reference current. In this regard, in one embodiment, control unit 68 may periodically and/or intermittently connect DAC 72, via switch 76 (or a multiplexer), to one or more reference current generators 60. The DAC 72 provides an analog representation of the reference current control word (for example, the previously determined reference current control word) to reference current generator 60 using switch 76. In this way, in the event that the reference current provided by one or more reference current generators 60 may not be (currently or impending) providing an enhanced, optimum, desired, predetermined and/or "minimum" reference current, for example, after a predetermined or given period of time (during operation or after setting, calibration and/or tuning), the control unit 68 "refreshes" those reference current generators 60.

Figure 9:
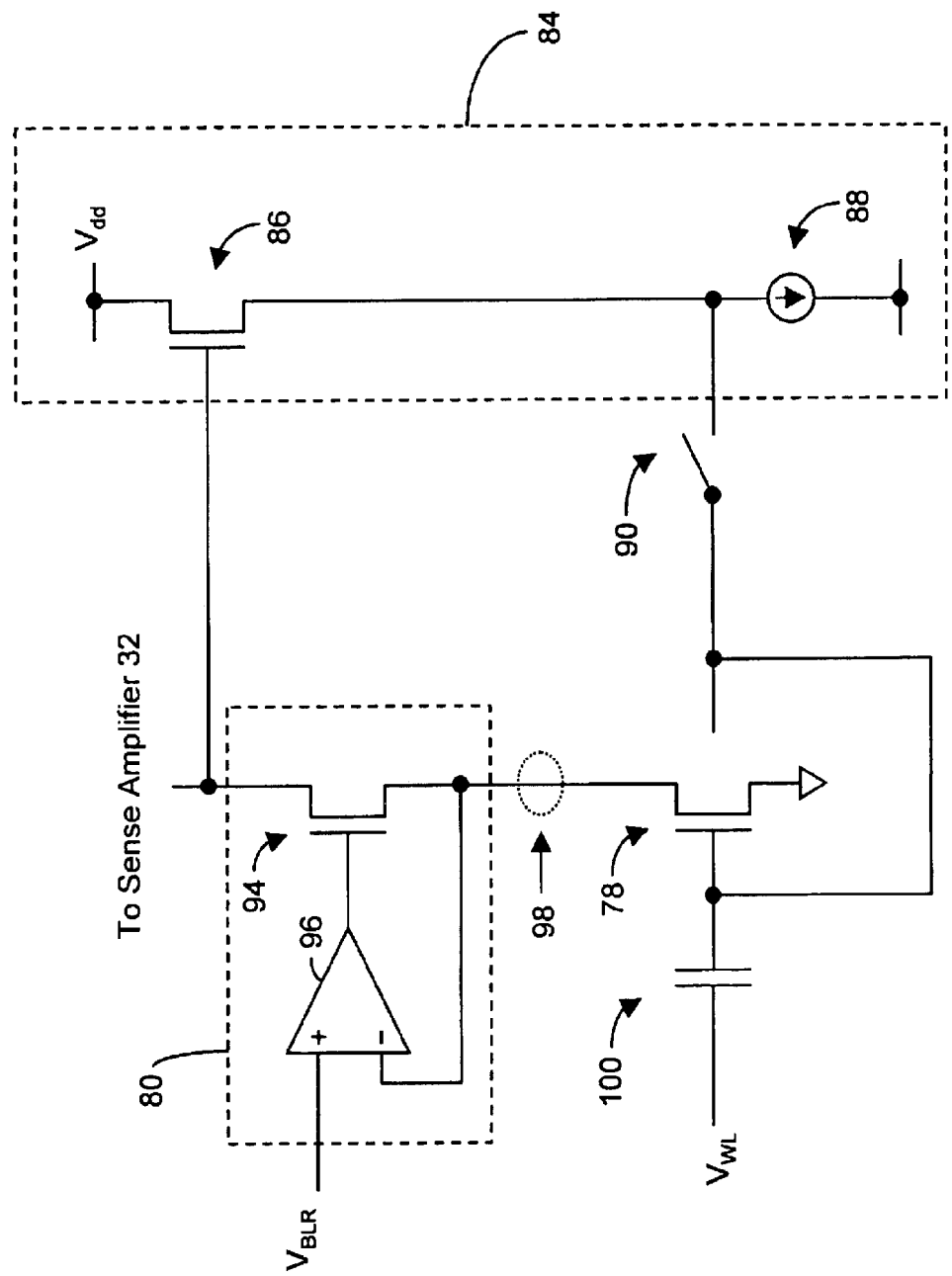

With reference to FIG. 9, since it may be difficult in practice to enable the substrate of transistor 78 of FIGS. 7 and 8 to match the behavior of a PD SOI transistor used as memory cell 12, (for example, because the PD SOI transistor has no body contact while transistor 78 includes a substrate contact), level shifter 84 applies a voltage signal to the gate of transistor 78 to which auxiliary capacitor 100 is connected in series. The gate voltage of transistor 78 approximately simulates substrate charges found in the PD SOI transistors of memory cells 12, provided the capacitance of auxiliary capacitor 100 is sufficiently large that the gate voltage of transistor 78 almost equals the external voltage $V_{WL}$.

Figure 10:
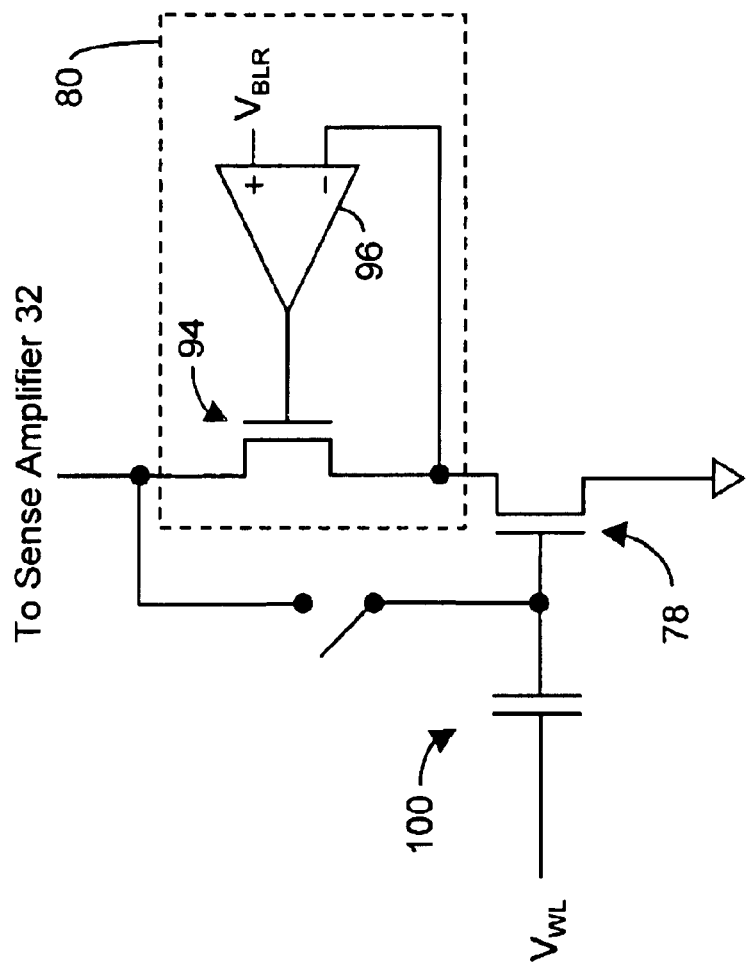

Notably, reference current generator 60 need not include level shifter 84 (see, FIG. 10). Where no level shifter is employed, the drain voltage of transistor 94 may be applied directly to the gate of transistor 78. (See, in addition, the circuitry illustrated in FIGS. 8 and 9 as well). However, in those embodiments where a level shifter is employed, the level shifter may be implemented using any number of techniques, for example, via a resistive divider and/or an operational amplifier(s). As such, any design and/or configuration of the level shifter, whether now known or later developed, is intended to come within the scope of the present invention.

Figure 11A:
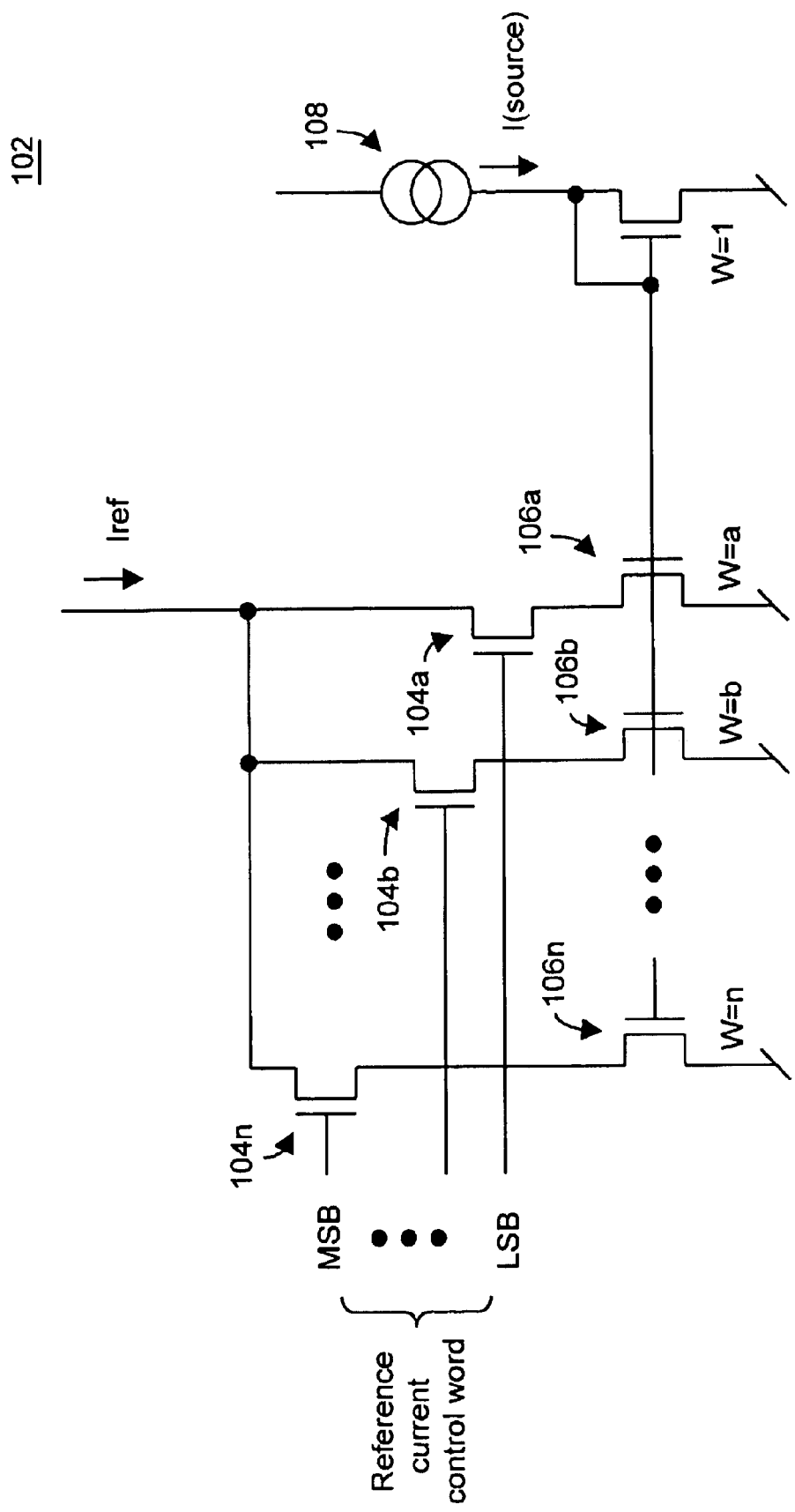
FIGS. 11A and 11B are exemplary schematic representations of suitable reference current generators according to a second aspect of the present invention.
Figure 12A:
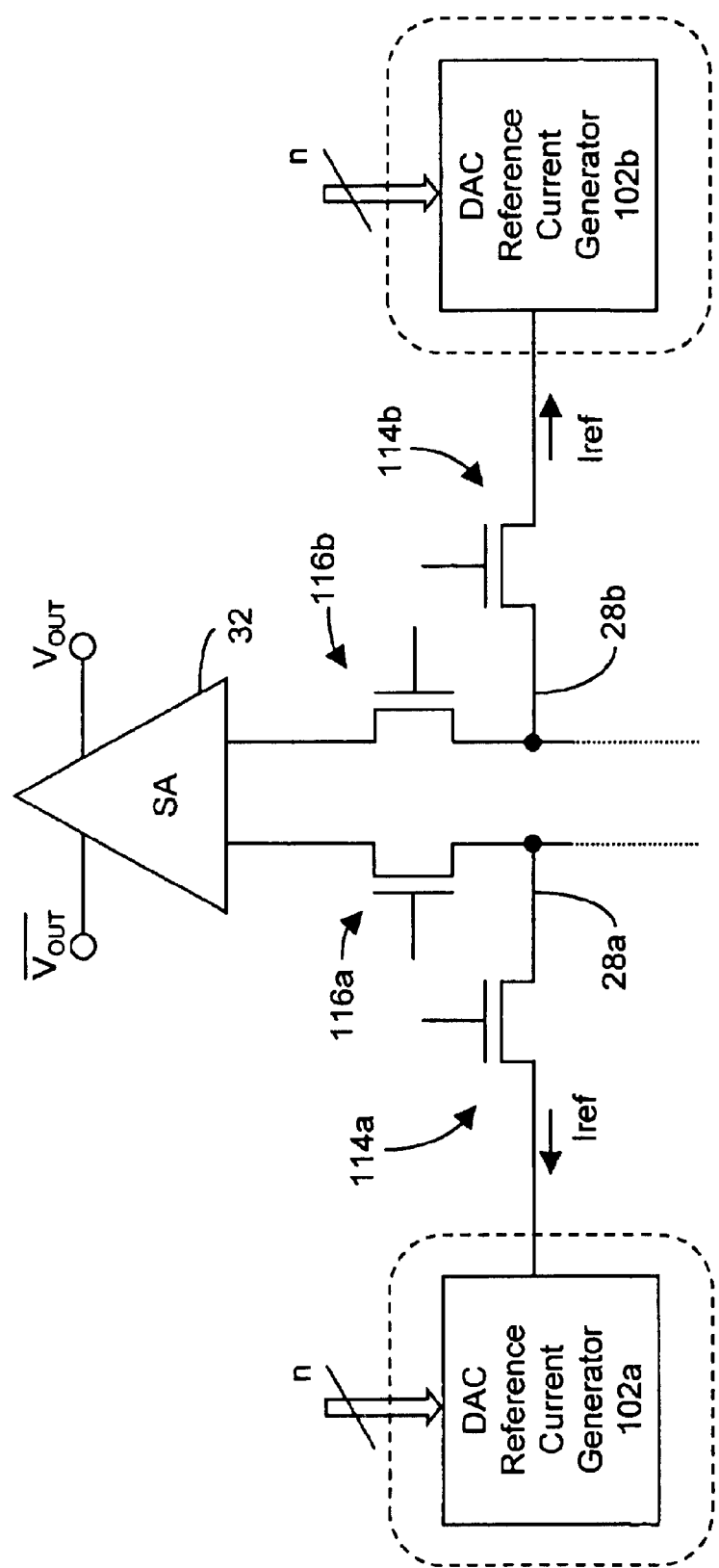
FIGS. 12A–12C are schematic block diagrams of certain embodiments of the digitally controlled reference current generator according to the second aspect of the present invention.

In another aspect of the present invention, the reference current generator may be implemented using a more digital circuit approach. With reference to FIGS. 11A and 12A, in one embodiment, reference current generator 102 includes a plurality of transistors 104a–n and 106a–n, and current source 108 arranged in a current mirror configuration. The plurality of transistors 104a–n and 106a–n, in combination, function as a variable resistor. In this regard, first plurality of transistors 104a–n is selectively controlled, using a reference current control word (including 2, 3, 4, 5 or more bits), to incorporate associated transistor 106a–n into the current path. The second plurality of transistors 106a–n includes the same or different conductance characteristics to provide or produce an adjustable and/or controllable current. In this regard, in one embodiment, for example, transistor 106a may have a conductance ratio, relative to transistor 106b, of half. As such, in this embodiment, transistor 106a conducts ½ the current relative to transistor 106b. Notably, the transistor conductance ratios may be implemented by selectively designing and controlling the relative widths of transistors 106.

It should be further noted that the ratios and/or weighting of the transistor may be determined and/or established to provide a predetermined, enhanced and/or optimum flexibility using the fewest transistors. Indeed, any and all weighting and/or ratios, whether now known or later developed, are intended to come within the scope of the present invention.

Figure 11B:
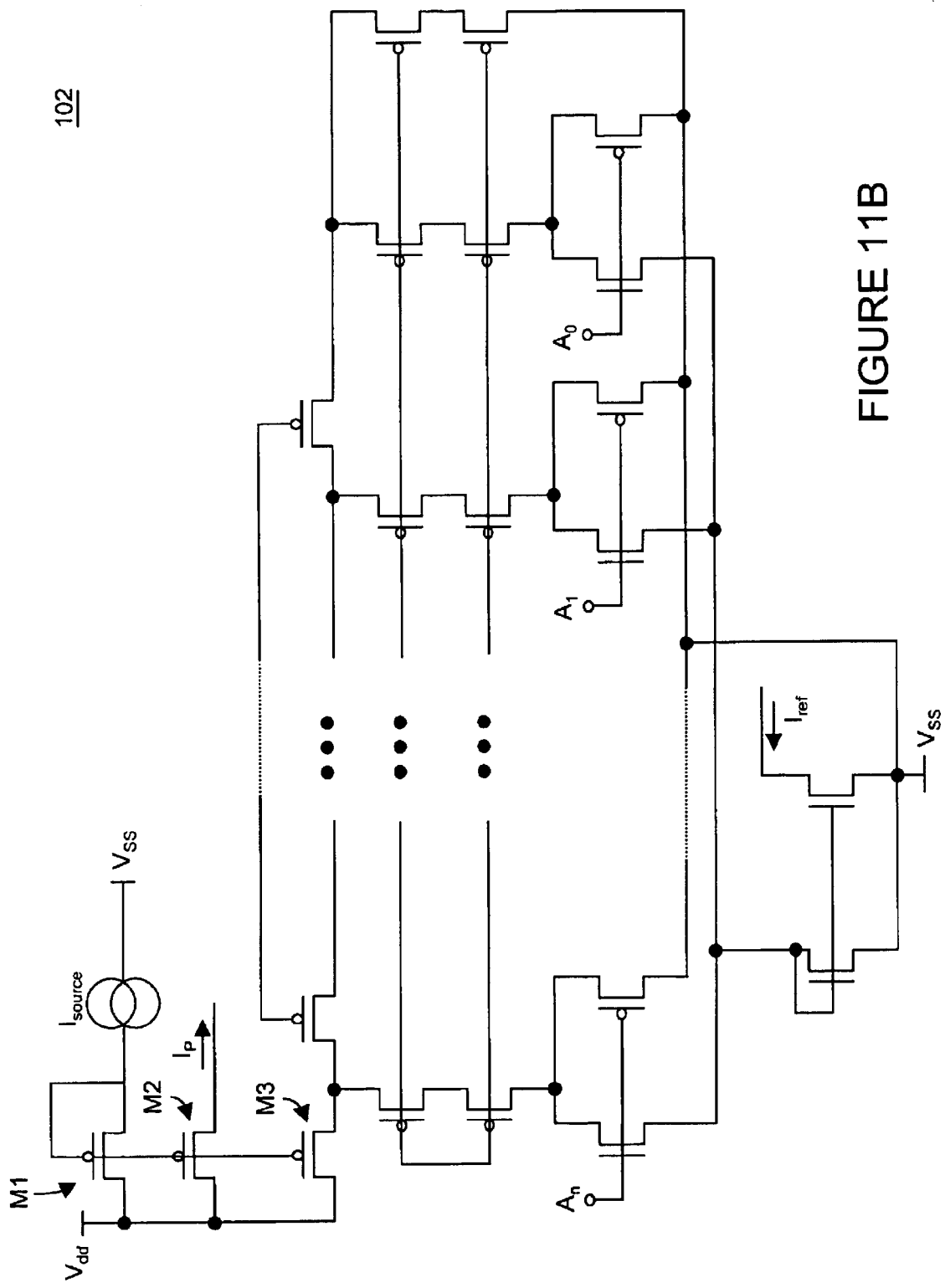

With reference to FIG. 11B, in another example, reference current generator 102 may be implemented as a MOS ladder DAC. For example, FIG. 11B illustrates an exemplary n-bit M2M ladder DAC where a full scale is imposed by the current source ($I_{source}$). The reference current generator 102 uses the reference current control word ($A_n$ to $A_0$) to output a suitable, predetermined, selected, optimum and/or enhanced reference current. The current source supplies the DAC reference current and the biasing current ($I_P$) through the current mirror M1, M2 and M3. Since $I_{ref,max}=2(I_P)$, the current source ($I_{source}$) may be used to drive the current mirror with matched transistors (M1, M2, M3) to provide the reference current for the DAC and the biasing current ($I_P$).

Notably, any digital to analog reference current generator may be implemented as reference current generator 102, whether now known or later developed. All such digital to analog reference current generators are intended to fall within the scope of the present invention.

The reference current control word may be fixed and/or predetermined. (see, for example, FIG. 12A). For example, in one embodiment, the reference current control word may be provided to reference current generator 102 at start-up/power-up and/or during an initialization sequence. In this embodiment, the reference current control word may be determined via a particular configuration of the state of a certain pin or pins on the package of device 10. Alternatively, the fixed or predetermined, preset or pre-programmed reference current control word may be permanently, semi-permanently or temporarily (i.e., until re-programmed) by way of a register (for example, a plurality of DRAM, SRAM, ROM, PROM, EPROM, EEPROM cells that are resident on memory device 10 or off-chip (for example, disposed on a memory card on which memory device 10 resides).

Figure 12B:
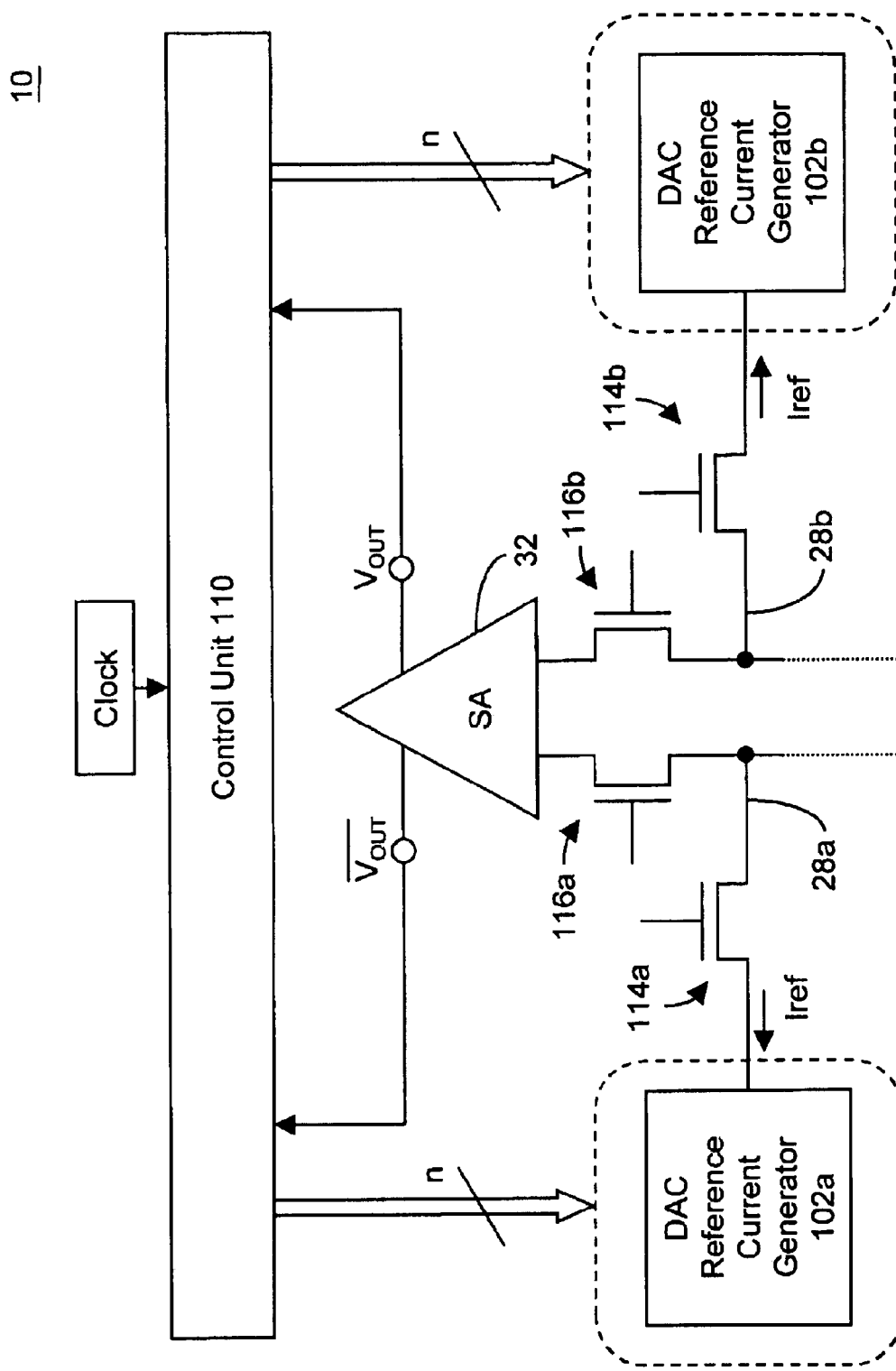
Figure 12C:
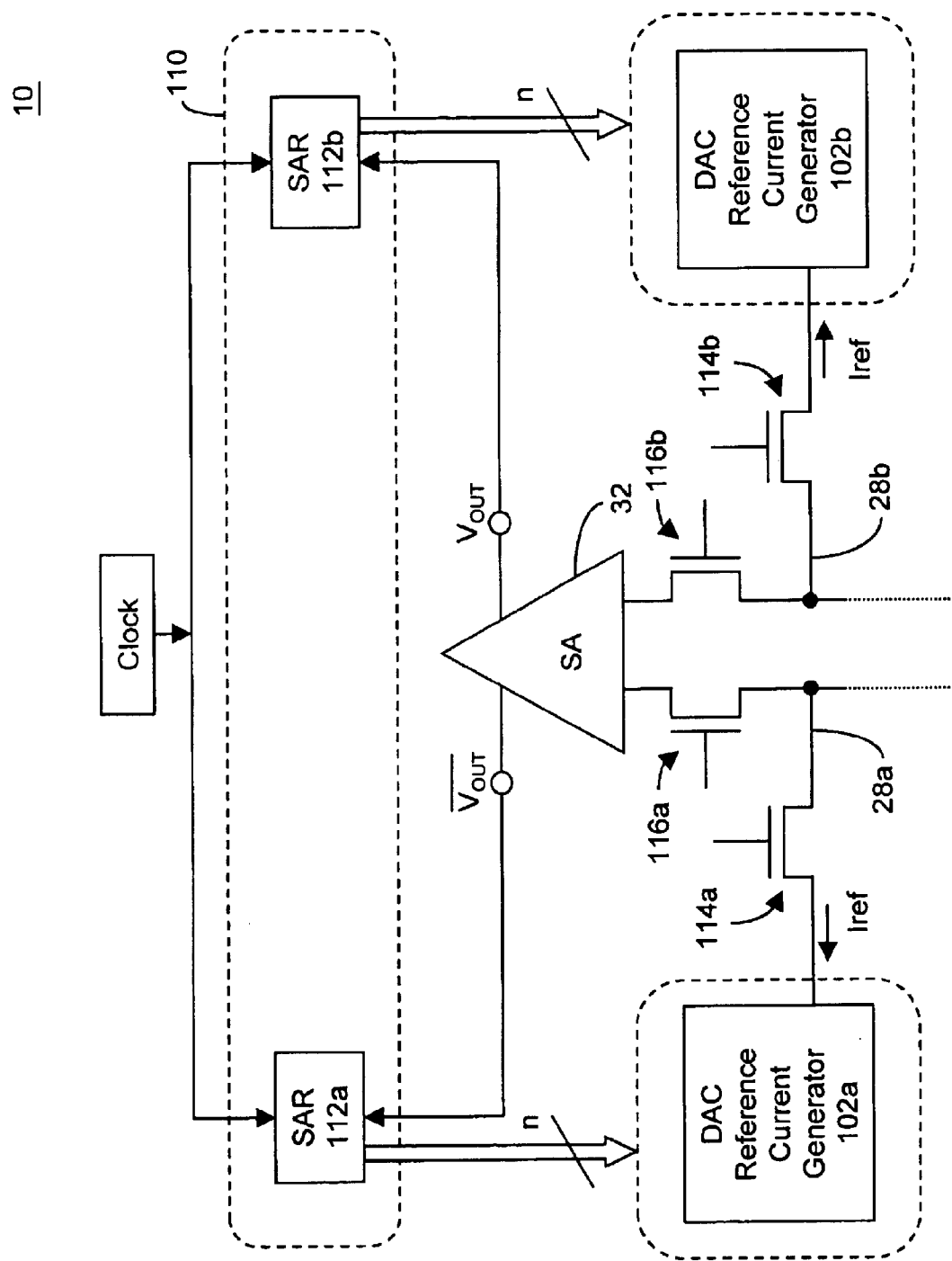

In another embodiment, with reference to FIGS. 12B and 12C, the reference current control word may be programmable via control unit 110. In this embodiment, an "initial" reference current control word may be provided at start-up/power-up and/or during an initialization sequence. Thereafter, the reference current control word may be re-programmed, via control unit 110, during operation to optimize, enhance, compensate and/or adjust the reference current (provided by reference current generator 102). For example, the reference current may be adjusted during operation of memory device 10 to address and/or compensate for variations in operating conditions (for example, to compensate for changes in temperature or response time parameters or characteristics).

Further, yet another embodiment, the reference current control word may be fine-tuned to enhance the performance of memory device 10. In this regard, after (or during) the performance of an initialization or re-initialization process, memory device 10 may implement fine adjustments to the predetermined, preset or pre-programmed reference current control word. The adjustments to the reference current control word may be accomplished using any techniques. Notably, all techniques for determining the reference current control word, whether now known or later developed, are intended to be within the scope of the present invention.

For example, in those embodiments where control unit 110 programs or re-programs one, some or all reference current generators 102, control unit 110 may implement a successive approximation approach to determine a reference current control word that, in conjunction with reference current generator 102, provides an optimized, enhanced, compensated and/or adjusted reference current. In this embodiment, control unit 110 may store the reference current control word in successive approximation registers 112a and 112b (see, for example, FIG. 12C).

Figure 13A:
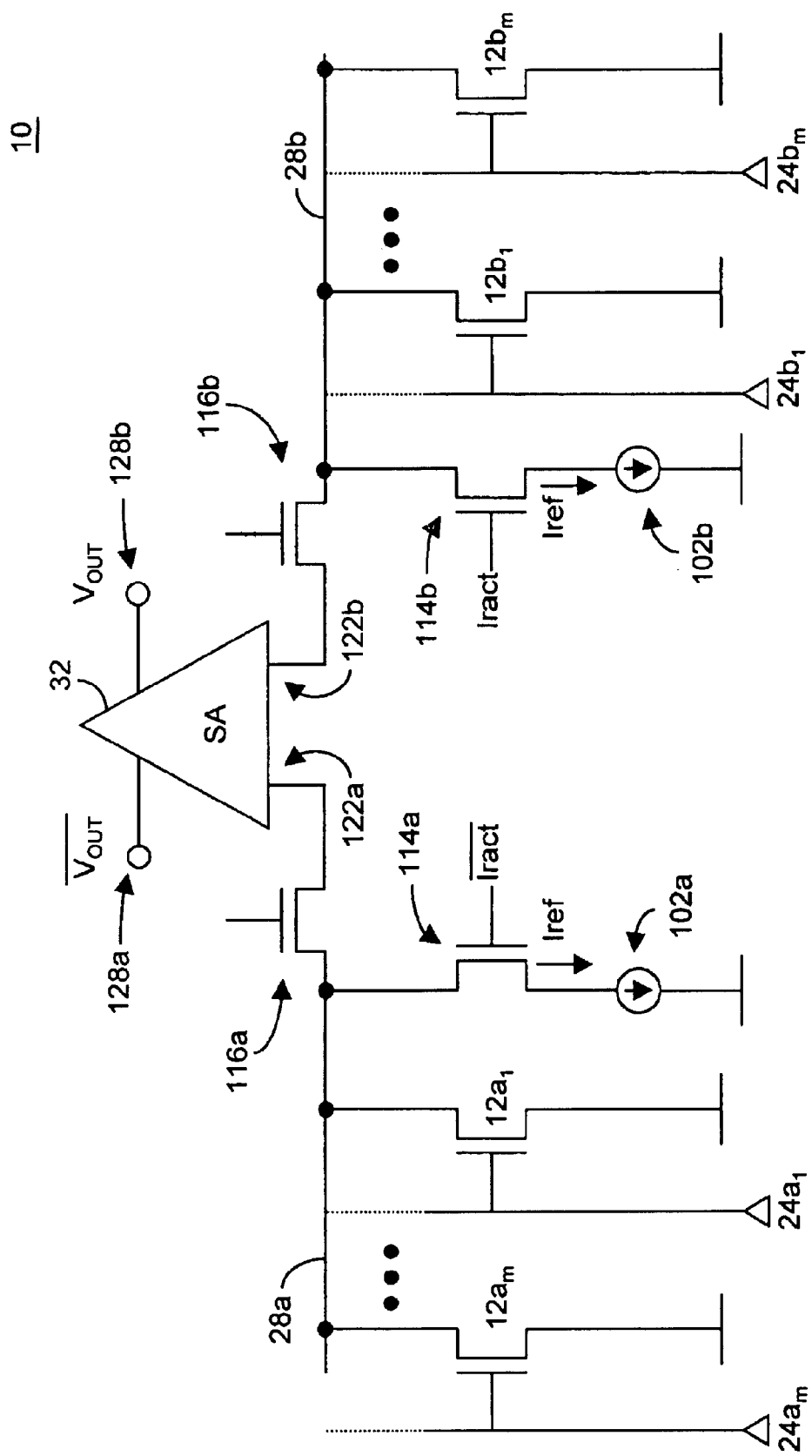
FIG. 13A is a schematic representation of a portion of a memory device, including a sense amplifier and two bit lines having a plurality of memory cells attached thereto, in accordance with an embodiment of the present invention.
Figure 13B:
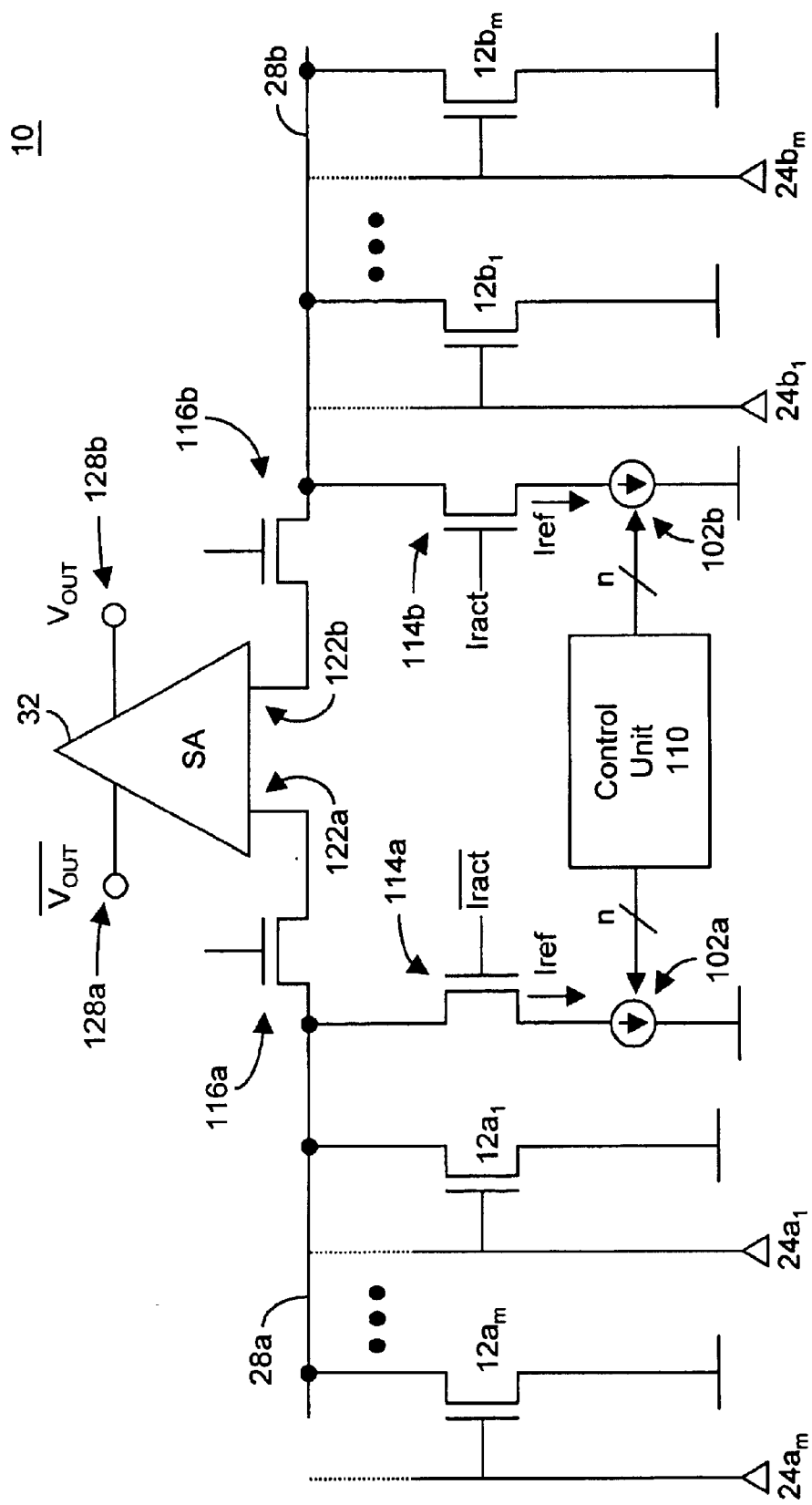
FIG. 13B is a schematic representation of a portion of a memory device, including a control unit, a sense amplifier and two bit lines having a plurality of memory cells attached thereto, in accordance with another embodiment of the present invention.

With reference to FIG. 13, in one embodiment, memory device 10 includes sense amplifier 32, one input of which is connected to first bit line 28a and the other input of which is connected to second bit line 28b. A plurality of memory cells $12a_1$ to $12a_m$ (for example, the one PD SOI transistor configuration) are connected to bit line 28a. The reference current generator 102a is also connected to bit line 28a (via transistor 114a), which is in turn connected to an input node of sense amplifier 32. Notably, bit line 28a is selectively connected to sense amplifier 32 via transistor 116a.

Similarly, bit line 28b is generally identical to bit line 28a and is connected to an input node of sense amplifier 32. A plurality of memory cells $12b_1$ to $12b_m$ (for example, the one PD SOI transistor configuration) are connected to bit line 28b. The reference current generator 102b is also connected to the bit line 28b (via transistor 114b), which is in turn connected to an input node of sense amplifier 32.

The reference current generator 102a selectively provides a reference current to sense amplifier 32 in those instances where sense amplifier 32 senses the data state of a memory cell $12b_1$ to $12b_m$ disposed on bit line 28b. In contrast, reference current generator 102b selectively provides a reference current to sense amplifier 32 in those instances where sense amplifier 32 is configured to sense the data state of a memory cell $12a_1$ to $12a_m$ disposed on bit line 28a.

Notably, reference current generators 102a and 102b are generally identical in design. The reference current generators 102a and 102b may be dependently or independently programmed to provide reference current source for reading memory cells $12b_1$ to $12b_m$ and $12a_1$ to $12a_m$, respectively. In one embodiment, control unit 110 may dependently or independently adjust, program and/or control reference current generators 102a and 102b to provide a predetermined, optimum and/or enhanced reference current (i.e., the magnitude of the reference current). (See, for example, FIG. 13B).

Figure 14A:
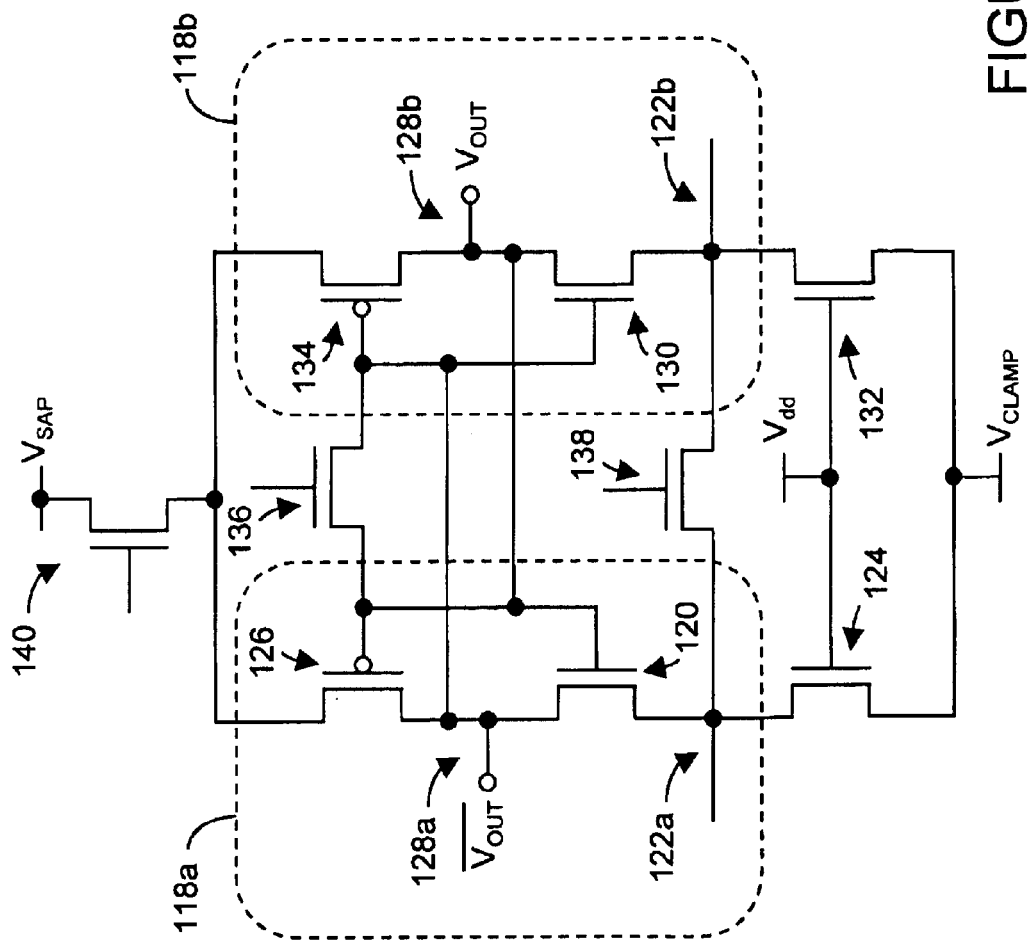
FIG. 14A is a detailed schematic representation of a sense amplifier in accordance with an embodiment of the present invention.
Figure 14B:
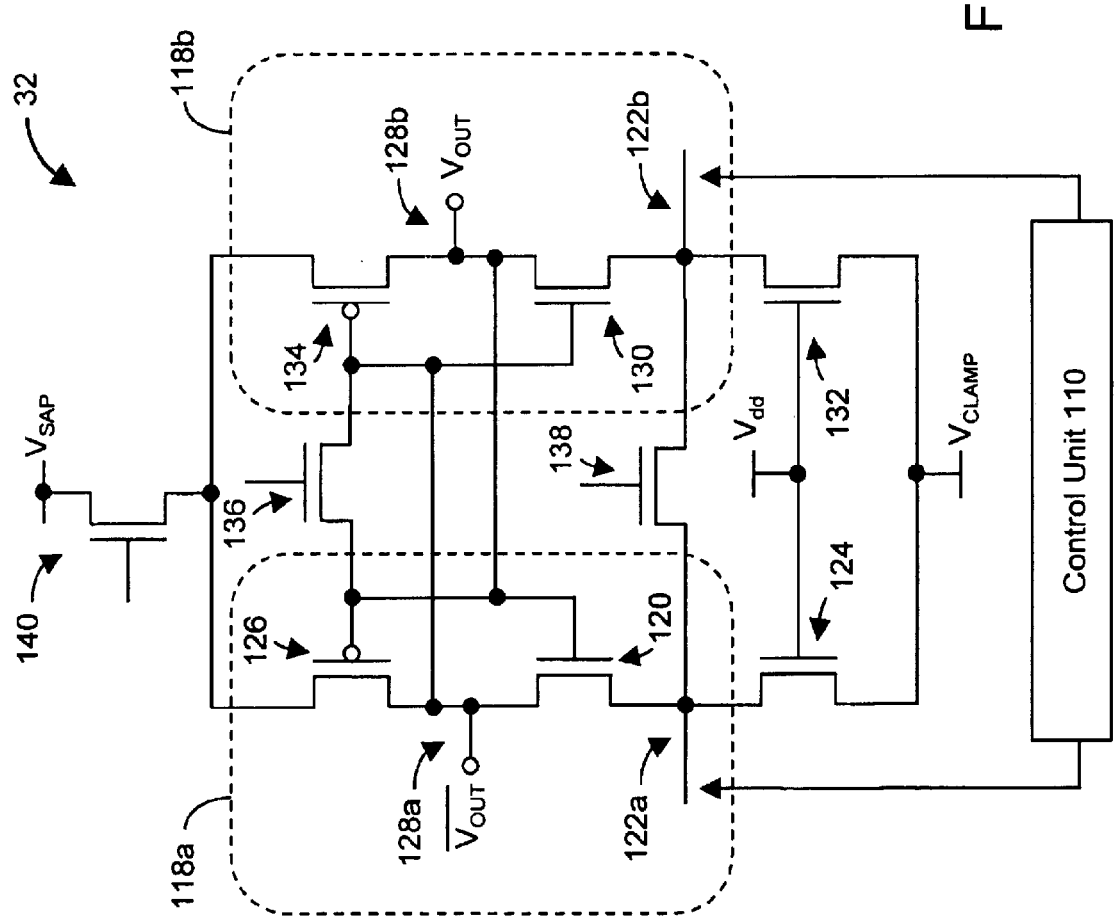
FIG. 14B is a detailed schematic representation of a sense amplifier, in conjunction with a control unit, in accordance with another embodiment of the present invention.

With reference to FIGS. 14A and 14B, in one embodiment, sense amplifier 32 includes a pair of cross-coupled CMOS inverters 118a and 118b. The inverter 118a includes NMOS transistor 120, having its source connected to input node 122a and to the drain of NMOS transistor 124. The inverter 118a also includes PMOS transistor 126. Notably, the drains of transistors 120 and 126 being connected together at output node 128a (i.e., $V_{out}$).

Similarly, CMOS inverter 118b includes NMOS transistor 130, having its source connected to input node 122b and to the drain of transistor 132. The inverter 118b also includes PMOS transistor 134. The drains of transistors 130 and 134 are connected at output node 128b. The gates of transistors 130 and 134 are connected together and to output node 128a, while the gates of transistors 120 and 126 are connected to output node 128b. Further, the gates of transistors 126 and 134 may be selectively connected via transistor 136, which functions as a switch, and input nodes 122a and 122b may be selectively connected via transistor 138, which also functions as a switch.

In addition, sense amplifier 32 is selectively connected to voltage rail $V_{SAP}$ via transistor 140. The gates of transistors 124 and 132 are connected together and to voltage rail $V_{dd}$. The sources of transistors 124 and 132 are connected to $V_{clamp}$, which is used to preset and to limit the voltage on the bit lines to a value that least disturbs the data in the memory cell but still provides a sufficient current to sense; typically about 0.5 volts. The voltage regulator 80 of FIGS. 8 and 9 serves the same purpose Notably, in the embodiment of FIG. 14B, output nodes 128a and 128b are selectively connected to inputs of control unit 110 during the programming, calibration and/or adjustment process of reference current generators 102a and/or 102b.

With reference to FIGS. 13A, 13B, 14A and 14B, in operation, the presence or absence of a net positive charge in the body of a transistor of memory cell 12 represents one of a binary logic states. As mentioned above, the threshold voltage of the transistor of memory cell 12 is dependent upon the charge storage state of the transistor. As a result, when a suitable gate-source voltage is applied to the transistor of memory cell 12, a source-drain current is conducted, the magnitude of which depends upon the threshold voltage of the transistor, which in turn depends upon its charge state. Accordingly, the logic state of the bit of data stored in memory cell 12 may be determined by comparison of the current conducted by the respective transistor with a reference current value.

It is found that the logic high data state and the logic low data state of the PD SOI transistors forming memory cells 12 approach each other with time (the charge within the electrically floating body region decays over time), but the logic high data state decays more slowly than the logic low data state. As such, it may be advantageous to set the magnitude of the reference current between the logic high and logic low data states, but closer to the more slowly varying logic high data state. In this way, the validity of the reference current magnitude for as long as possible between data refreshing operations may be ensured.

In one embodiment, the magnitude of the reference current produced by reference current generator 102a, a logic high data state is initially written to one or more (preferably all) of memory cells $12b_1$ to $12b_m$, which are connected to bit line 28b. This may be accomplished by applying a suitable voltage to signal bit line 28b, and suitable voltage signals to word lines $24b_1$ to $24b_m$. At this stage, bit lines 28a and 28b are isolated from sense amplifier 32 by turning off transistors 116a and 116b (i.e., opening the switches), respectively. Notably, sense amplifier 32 is disabled by turning off transistor 140 and turning on transistors 136. In this way, sense amplifier 32 consumes little to no power.

The binary logic state of the data stored in memory cell 12 may be read by initiating a precharge phase of the reading operation. In this regard, transistor 140 is turned on, providing power to sense amplifier 32. The voltage rail value $V_{SAP}$ may be reduced in order to properly adjust the switching point(s) of inverters 118a and 118b. Moreover, transistor 138 may be enabled or turned-on in order to equalize or balance the inputs of sense amplifier 32. In addition, transistors 116a and 116b are turned on to facilitate sensing of the charge on bit lines 28a and 28b by sense amplifier 32. The other voltage rail value $V_{CLAMP}$ may be brought to the reading voltage.

Notably, transistor 136 is also switched on to force equal voltages onto output nodes 128a and 128b of sense amplifier 32. The voltage at output nodes 128a and 128b is determined by the device values (for example, the device sizes, width and/or length) of transistors 120, 126, 130 and 134 and both $V_{SAP}$ and $V_{CLAMP}$ voltages.

At the end of the precharge phase, the operation to read the data logic state of transistor(s) of memory cell $12a_m$ begins by switching off transistor 138, and setting the reading voltage on word lines $24a_m$ to cause the corresponding transistor(s) of memory cell $12a_m$ to conduct a current. At the same time, reference current generator 102b is connected to bit line 28b (and input node 122b of sense amplifier 32 by turning on transistor 114b. At this moment, memory cell $12a_m$ and reference current generator 102b start discharging the parasitic capacitances of both bit lines 28a and 28b, respectively, and a differential voltage is established at input nodes 122a and 122b of sense amplifier 32.

Notably, reference current generator 102a is disconnected from bit line 28a by maintaining transistor 114a in an off state. Indeed, reference current generator 102a is employed to only read memory cells connected to bit line 28b.

After completion of the sense portion of the reading operation, a restore portion of the reading operation may then be commenced by switching off transistor 136, reducing $V_{CLAMP}$ to $V_{ss}$ (a low voltage, preferably ground), and possibly increasing $V_{SAP}$ to $V_{dd}$ in order to obtain proper logic levels at output nodes 128a and 128b. Because of the voltage difference at inputs nodes 122a and 122b of sense amplifier 32, the source currents of transistors 120 and 130 differ, which in turn produces a voltage difference at the output nodes 128a and 128b of sense amplifier 32. This voltage difference is rapidly amplified by cross-coupled latches formed by inverters 118a and 118b. The voltage difference between output nodes 128a and 128b of sense amplifier 32 is then input to control unit 110, where it is processed to generate a reference current control word, which controls reference current generators 102a and 102b.

In those embodiment where memory device 10 includes control unit 110 to adjust, control and/or program reference current generator 102, control unit 110 may implement a successive approximation algorithm to determine a reference current control word to provide to reference current generator 102 in order to generate a predetermined, desired, enhanced and/or optimum reference current. As mentioned above, the successive approximation algorithm is exemplary, and all techniques and/or algorithms for determining the reference current control word, whether now known or later developed, are intended to be within the scope of the present invention.

Figure 15:
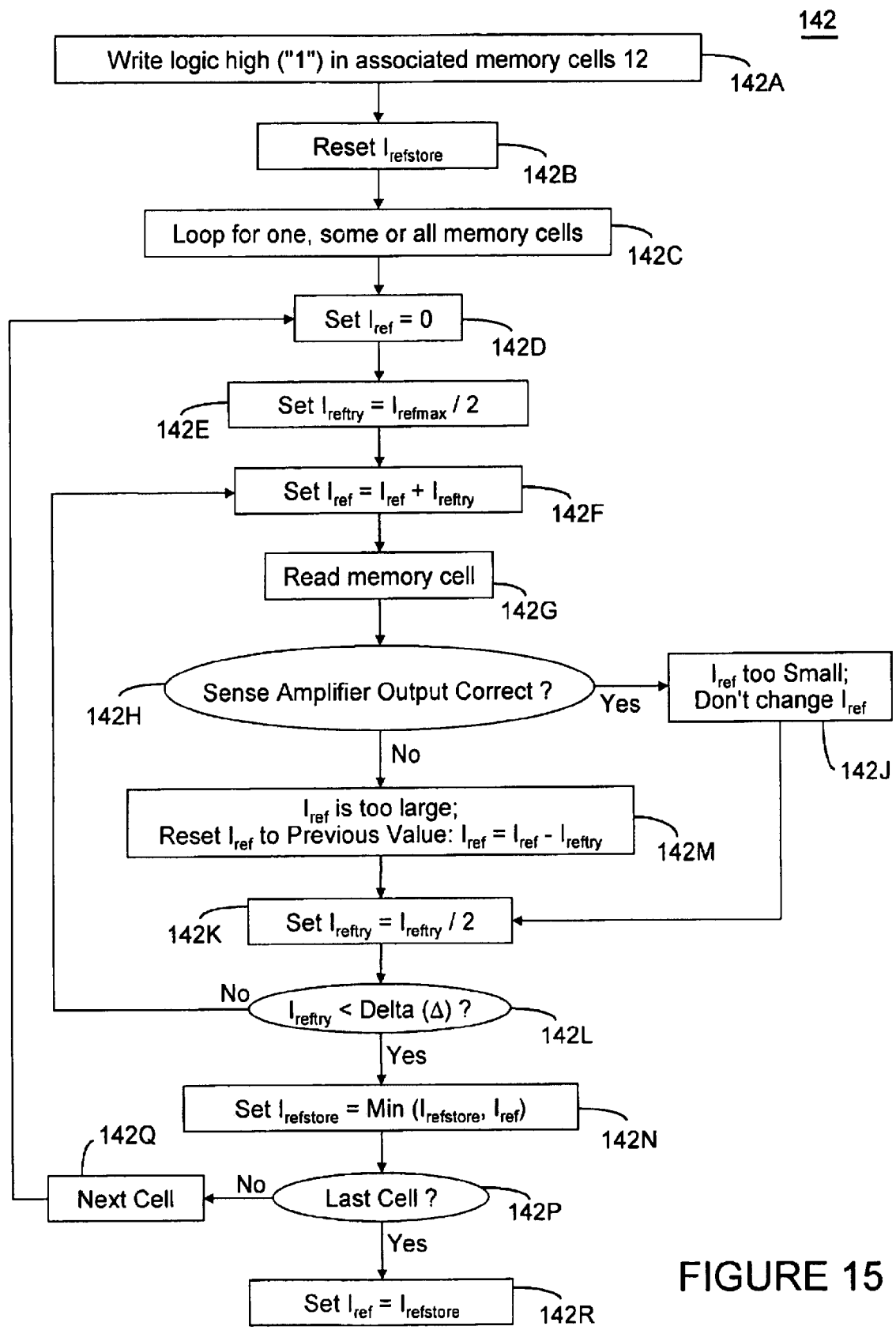
FIG. 15 is a flow diagram of an exemplary successive approximation technique for determining the reference current control word according to certain embodiments of the present invention.

In one embodiment, an exemplary algorithm 142 of FIG. 15 may be implemented and/or executed at power up (i.e., before using the memory device), and/or intermittently or periodically during normal operation to compensate for, for example, drift due to temperature variations. Briefly, an intention of exemplary algorithm 142 is to determine the largest "valid" value for the reference current. In this way, the current output by memory cells 12 that corresponds to logic low data state increases with time, while it remains substantially constant relatively to logic high data state. Notably, although exemplary algorithm 142 is suited for this application, other algorithms are suitable for determining an appropriate value (or an optimal value based on other criteria or criterion). Furthermore, exemplary algorithm 142 assumes that the current from memory cells 12 which corresponds to logic low data state (A0) and logic high data state (A1) provides a suitable read window to permit a valid reference current value to be identified and/or determined.

First, memory cells 12 that are associated with a particular reference current generator 102 (for example, memory cells $12b_1$ to $12b_m$ are associated with reference current generator 102a) are programmed to a logic high data state (indicated as 142A). The current and/or predetermined value of the magnitude of reference current ($I_{REFSTORE}$) output by reference current generator 102, which is representative of reference current control word that may be maintained in control unit 110, is reset at 142B. Notably, this process may be performed for one, some or all memory cells associated with reference current generator 102. In those instances where the algorithm is to be performed for one, some or all memory cells that are associated with a given reference current generator 102, this instruction is provided at 142C.

With continued reference to FIG. 15, thereafter, the reference current value ($I_{REF}$) of reference current generator 102a is then set to a known value (for example, zero) at 142D, and an incremental value ($I_{REFTRY}$) of reference current is set at half of a nominal maximum value ($I_{REFMAX}$) of the reference current (see, 142E). The maximum value ($I_{REFMAX}$) may be determined or estimated empirically (for example, via simulation or testing of a circuit on silicon), and/or chosen arbitrarily.

The reference current may then be increased by incremental value ($I_{REFTRY}$) at 142F and the state of a first memory cell 12 (for example, memory cells $12b_1$ to $12b_m$) is read by sense amplifier 32 (see, 142G). Since it is known that all of associated memory cells were initially programmed with a logic high data state (A1), control unit 110 determines, at 142H, whether the output of sense amplifier 32 is correct. If the output of sense amplifier 32 is correct, the reference current is less than or equal to the largest valid value for the reference. Notably, at this point it may not be possible to know (with certainty) whether the reference current is too small or if it is large enough to produce a correct output for a logic low data state (A0) as well.

However, since algorithm 142 is determining the largest valid value for the reference current, and the last tested reference value produced a correct determination (i.e., sense amplifier 32 sensed a logic high data state (A1)), the value of the reference current ($I_{REF}$) is maintained unchanged, and the incremental value ($I_{REFTRY}$) is halved (see, 142J and 142K). The control unit 110 may then determine whether the incremental value ($I_{REFTRY}$) is smaller than a predetermined limiting value of delta ($\Delta$) at 142L, and if the limiting value has not been reached, the process returns to 142F.

Notably, the delta ($\Delta$) corresponds to the precision of the reference current adjustment. It may be advantageous to be small enough with respect to the separation of the respective current values of memory cells 12 corresponding to the two data states ("A1" and "A0"). In this way, algorithm 142 may provide a reference current value (or reference current control word) that also produces valid output for logic low data state ("A0").

However, if it is determined that sense amplifier 32 has provided an incorrect output, the reference current must be too large (see, 142M), and therefore cannot be used to distinguish between the binary data states ("A1" and "A0"). Accordingly, $I_{REF}$ is reduced to its previous value and control unit 110 implements 142K.

When the incremental value ($I_{REFTRY}$) is determined to be less than delta ($\Delta$) at 142L, the stored value of the magnitude of reference current ($I_{REFSTORE}$) is set as the minimum value of the reference current ($I_{REF}$) determined by control unit 110 for a particular memory cell 12 at 142N. Notably, the value of the magnitude of reference current ($I_{REFSTORE}$) may be the largest acceptable value for the reference current for all the memory cells that were "examined".

The process may be repeated for one, some or all of memory cells 12 on bit line 128b. In this regard, at 142P, control unit 110 determines whether the pervious memory cell 12 under examination is the last memory cell 12 to be examined. If not, the next memory cell 12 is connected to bit line 28b, at 142Q, and the process returns to 142D. If control unit 110 determines that the previous memory cell 12 is the last cell to be examined, the magnitude of reference current ($I_{REF}$) generated by reference current generator 102a is set to the stored minimum reference value ($I_{REFSTORE}$) at 142R. In this way, a reference current value is set which may be the largest suitable value for the data states ("A1" and "A0") of all memory cell 12 connected to bit line 28b. The memory cells 12 may then be reprogrammed with unknown data states or previous data states subsequently determined by comparing their output currents with the reference current set in reference current generator 102b by sense amplifier 32.

Notably, control unit 110 may perform or execute the same or similar process for all reference current generator 102 connected to other bit lines 28 in memory device 10 (for example, current generator 102b). In this way, each of reference current generators 102 is suitably programmed.

An algorithm may also be employed to determine an appropriate, optimum and/or enhanced reference current when memory cells 12 that are associated with a particular reference current generator 102 are programmed to a logic low data state. Indeed, control unit 110 may also execute an algorithm when the memory cells 12 are sequentially programmed to a logic high data state and a logic low data state. The control unit 68 may then determine the most appropriate reference current in the event a different reference current is determined for a logic high data state and a logic low data state (for example, an average of the reference currents).

It may be advantageous to determine an appropriate, optimum and/or enhanced reference current to be output or provided by less than all of reference current generators 102 and provide the reference current control word that is representative of the appropriate, optimum and/or enhanced reference current to other reference current generators 102. For example, an appropriate reference current control word may be determined for reference current generator 102a and provided to both reference current generators 102a and 102b (i.e., reference current generators 102 that are associated with a given sense amplifier 32). In this regard, reference current generators 102a and 102b provide reference currents for memory cells 12 disposed on bit lines 28a and 28b, which are located in the same general vicinity in device 10. In this way, essentially one half of the calibration and/or adjustment routine for reference current generators 102 are eliminated.

Moreover, in another embodiment, a reference current control word may be determined for some or all of reference current generators 102 using, for example, any of the techniques described herein, and thereafter intermittently and/or periodically "tuned" or "tweaked" to account or compensate for changes in the performance of device 10 (for example, changes due to changes in temperature). As such, in this embodiment, at start-up, initialization or re-initialization, control unit 110 may determine a reference current control word (that, in conjunction with reference current generator 102 provides a suitable, predetermined, optimum and/or enhanced reference current) and program reference current generator 102, as described above. Thereafter, the reference current may be adjusted during operation of memory device 10 by determining a relative adjustment to the "initial" reference current control word (determined during, for example, at start-up/power-up and/or an initialization sequence).

The relative adjustment(s) may be determined, in any manner described herein, by examining one or some representative reference current generator(s) 102 (for example, one or more reference current generator(s) 102 in an array and/or memory or sense bank). After determining the relative adjustment(s), control unit 110 may implement the change to the reference current control word for all reference current generator(s) 102 (even those reference current generator(s) 102 that have not be directly "analyzed" by the control unit 110). In this way, reference current changes, modifications and/or programming may be accomplished more quickly so that normal operation of the device is not affected. Indeed, intermittently and/or periodically "tuning" or "tweaking" to compensate for changes in the performance of device 10 may be performed in a manner similar to refresh operation of a DRAM so that there is no impact on the normal operation of device 10.

It should be noted that control unit 110 may be comprised of a plurality of control units 110a–x. Each control unit 110 may be associated with one or more sense amplifiers, memory or sense amplifier banks and/or arrays. In this way, calibration, programming and/or adjustment of reference current generator(s) 102 may be performed more quickly as well as more often (without impacting the performance of device 10).

There are many inventions described and illustrated herein. While certain embodiments, features, materials, configurations, attributes and advantages of the inventions have been described and illustrated, it should be understood that many other, as well as different and/or similar embodiments, features, materials, configurations, attributes, structures and advantages of the present inventions that are apparent from the description, illustration and claims. As such, the embodiments, features, materials, configurations, attributes, structures and advantages of the inventions described and illustrated herein are not exhaustive and it should be understood that such other, similar, as well as different, embodiments, features, materials, configurations, attributes, structures and advantages of the present inventions are within the scope of the present invention.

For example, the voltage levels to implement the read and write operations (for example, $V_{WL}$) may be consistent with the exemplary voltage levels described and illustrated in Semiconductor Memory Device Patent Application, Semiconductor Memory Device Patent Application II, and/or Semiconductor Memory Cell, Array, Architecture and Device, and Method of Operating Same. As mentioned above, the entire contents of the immediately aforementioned Patent Application, including, for example, the features, attributes, architectures, configurations, materials, techniques and advantages described and illustrated therein, are incorporated by reference herein.

Figure 16A:
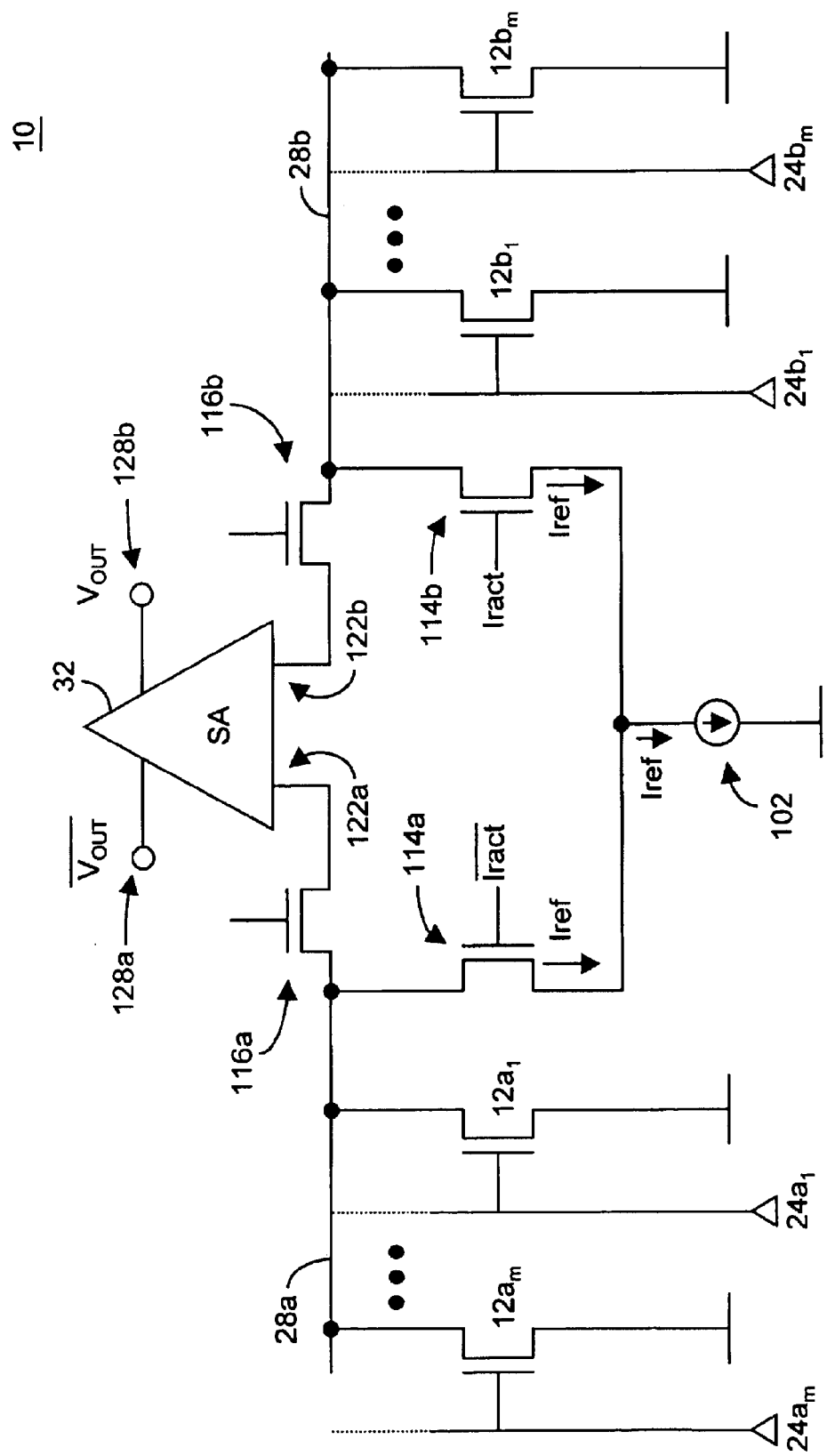
FIG. 16A is a schematic representation of a portion of a memory device, including a sense amplifier and one reference current generator, in accordance with an embodiment of the present invention.
Figure 16B:
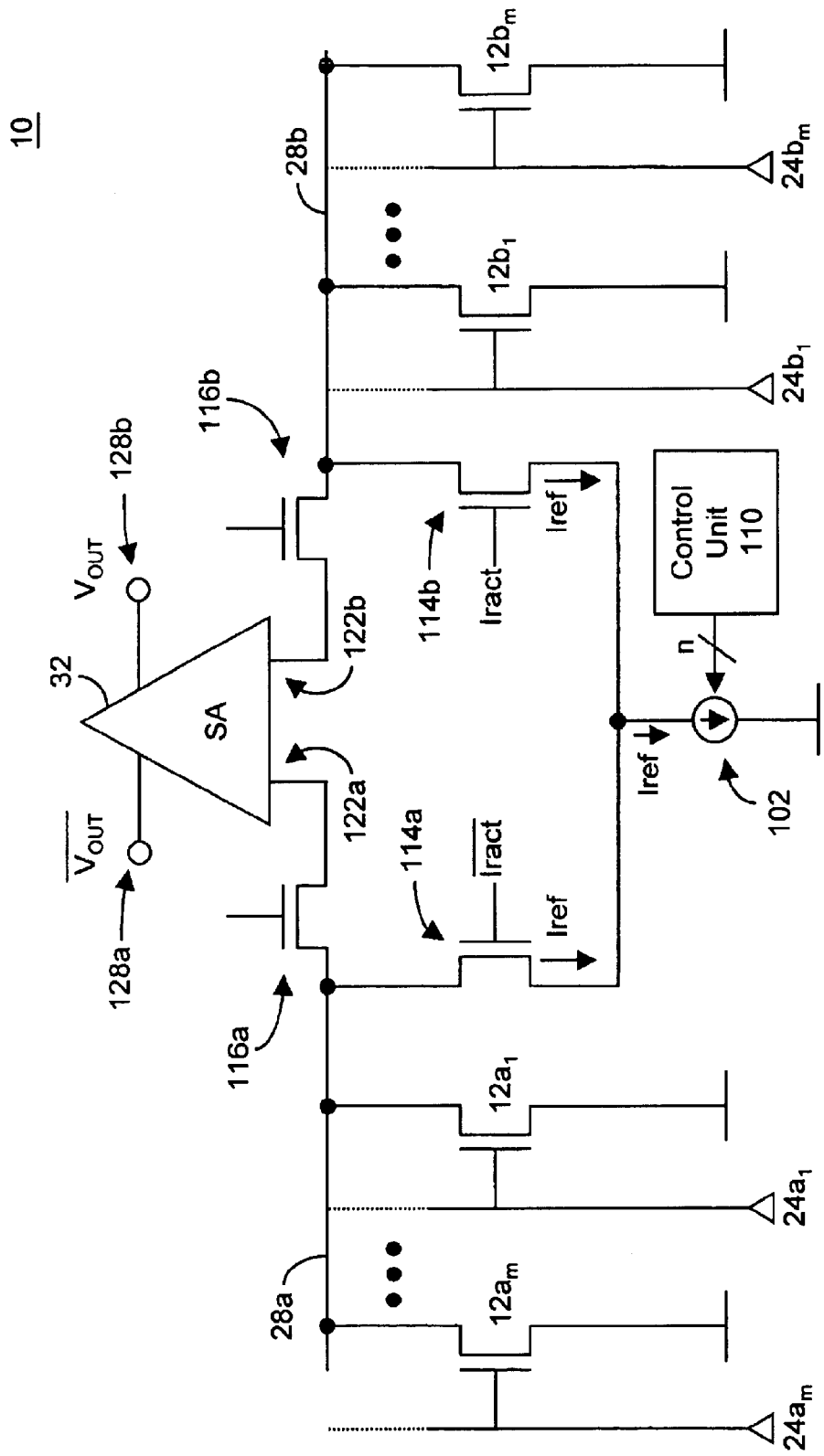
FIG. 16B is a schematic representation of a portion of a memory device, including a control unit, a sense amplifier and one reference current generator, in accordance with another embodiment of the present invention.

In addition, the inventions described herein may be applied to any memory architecture and/or layout, including those described and illustrated in Semiconductor Memory Device Patent Application, Semiconductor Memory Device Patent Application II, and/or Semiconductor Memory Cell, Array, Architecture and Device, and Method of Operating Same. The memory architecture may be an open bit line configuration and/or a folded bit line configuration. In those instances where the memory architecture is a folded bit line configuration, it may be advantageous to employ one reference current generator for a pair of bit lines. (See, for example, FIGS. 16A and 16B). Notably, the configuration illustrated in FIGS. 16A and 16B may also be implemented in an open bit line architecture.

While a significant portion of this description includes details (for example, clear, write, read and inhibit voltages) directed to N-channel transistors, the inventions (and embodiments thereof) described herein are entirely applicable to P-channel transistors. In such embodiments, majority carriers in body region 18 are electrons and minority carriers are holes. Indeed, the memory arrays may be comprised of N-channel, P-channel and/or both types of transistors. Moreover, the circuitry that is peripheral to the memory array (for example, row and column address decoders, not illustrated herein) may include P-channel and/or N-channel type transistors, including transistors like transistor 14.

Notably, where P-channel type transistors are employed as memory cells 12 in the memory array(s), suitable clear, write, read and inhibit voltages are well known to those skilled in the art in light of this disclosure. Accordingly, for sake of brevity, these discussions will not be repeated.

Further, memory cell(s) 12 (as well as memory array and matrices 58a–n) may also employ the structure, features, attributes, architectures, configurations, materials, techniques and advantages described and illustrated in non-provisional patent application entitled "Semiconductor Device", which was filed on Feb. 18, 2004, by Fazan and Okhonin, and assigned Ser. No. 10/487,157 (hereinafter "Semiconductor Device Patent Application"). The entire contents of the Semiconductor Device Patent Application, including, for example, the inventions, features, attributes, architectures, configurations, materials, techniques and advantages described and illustrated therein, are hereby incorporated by reference herein.

As mentioned above, the transistor(s) (for example, the transistor(s) of memory cells 12) described herein may be symmetrical or non-symmetrical devices. Where the transistors are symmetrical, the source and drain regions are essentially interchangeable. However, where the transistors are non-symmetrical devices, the source or drain regions of transistors may have different electrical, physical, doping concentration and/or doping profile characteristics. As such, the source or drain regions of the non-symmetrical device are typically not interchangeable.

Notably, the present invention may also compensate for offset currents and/or voltages that may arise because of transistor mismatch(es) in sense amplifier 32 due to the feedback or closed-loop control of the reference current. (See, for example, FIG. 7). In this way, reference current generators 60 and 102 output reference currents that addresses, minimizes and/or eliminates such offset currents and/or voltages.

What is claimed is:

1. A semiconductor dynamic random access memory device comprising:

a plurality of bit lines, including a first bit line and a second bit line;

a sense amplifier, having a first input coupled to the first bit line and a second input coupled to the second bit line;

a first digitally controlled reference current generator, selectively coupled to the first bit line, to generate a first reference current in response to a first reference current control word;

a plurality of memory cells, including a first memory cell coupled to the first bit line and a second memory cell coupled to the second bit line, to store a first data state and a second data state, each memory cell includes:
   at least one transistor including a source region, a drain region, a body region disposed between and adjacent to the source region and the drain region, wherein the body region is electrically floating, and a gate spaced apart from, and capacitively coupled to, the body region;
   wherein the transistor includes a first state which is representative of a first charge in the body region and a second state which is representative of a second charge in the body region, and
wherein the memory cell is in: (1) the first data state when the transistor is in the first state and (2) the second data state when the transistor is in the second state; and
wherein the sense amplifier uses the first reference current to sense whether the second memory cell is in the first data state or the second data state.

2. The semiconductor dynamic random access memory device of claim 1 further including a second digitally controlled reference current generator, selectively coupled to the second bit line, to generate a second reference current in response to a second reference current control word wherein the sense amplifier uses the second reference current to sense whether the first memory cell is in the first data state or the second data state.

3. The semiconductor dynamic random access memory device of claim 1 wherein the first digitally controlled reference current generator is selectively coupled to the second bit line when the sense amplifier is sensing the data state of the first memory cell, and wherein the sense amplifier uses the first reference current to sense whether the first memory cell is in the first data state or the second data state.

4. The semiconductor dynamic random access memory device of claim 1 further including a control unit, coupled to the first digitally controlled reference current generator, to generate the first reference current control word.

5. The semiconductor dynamic random access memory device of claim 4 wherein the control unit uses a successive approximation technique to determine the first reference current control word.

6. The semiconductor dynamic random access memory device of claim 5 wherein the control unit is selectively coupled to the sense amplifier to execute the successive approximation technique that determines the first reference current control word.

7. The semiconductor dynamic random access memory device of claim 1 further including:
   a second digitally controlled reference current generator, coupled to the second bit line, to generate a second reference current in response to a second reference current control word wherein the sense amplifier uses the second reference current to sense whether the first memory cell is in the first data state or the second data state; and
   a control unit, coupled to the first and second digitally controlled reference current generators, to generate the first reference current control word and the second reference current control word.

8. The semiconductor dynamic random access memory device of claim 1 further including a control unit to generate the first reference current control word during an initialization sequence of the memory device.

9. The semiconductor dynamic random access memory device of claim 1 further including a control unit to generate the first reference current control word during normal operation of the memory device.

10. The semiconductor dynamic random access memory device of claim 1 further including a second digitally controlled reference current generator, coupled to the second bit line, to generate a reference current in response to the first reference current control word wherein the sense amplifier uses the reference current to sense whether the first memory cell is in the first data state or the second data state.

11. The semiconductor dynamic random access memory device of claim 1 wherein the first and second bit lines are connected to the sense amplifier in an open bit line architecture.

12. The semiconductor dynamic random access memory device of claim 1 wherein the first and second bit lines are connected to the sense amplifier in a folded bit line architecture.

13. A semiconductor dynamic random access memory device comprising:
   a plurality of memory cells arranged in a matrix of rows and columns, each memory cell includes:
      at least one transistor including a source region, a drain region, a body region disposed between and adjacent to the source region and the drain region, wherein the body region is electrically floating, and a gate spaced apart from, and capacitively coupled to, the body region;
      wherein the transistor includes a first state which is representative of a first charge in the body region and a second state which is representative of a second charge in the body region, and wherein the memory cell is in: (1) the first data state when the transistor is in the first state and (2) the second data state when the transistor is in the second state; and
   a plurality of bit lines, including a first bit line connected to a first memory cell and a second bit line connected to a second memory cell;
   a plurality of digitally controlled reference current generators, each digitally controlled reference current generator being selectively coupled to an associated one of the bit lines to provide a reference current in response to an associated reference current control word; and
   a plurality of sense amplifiers, each sense amplifier having a first input coupled to first associated bit line and a second input coupled to a second associated bit line wherein each sense amplifier senses: (1) the data state of the memory cells connected to the first associated bit line using the reference current provided by a digitally controlled reference current generator connected to the second associated bit line, and (2) the data state of the memory cells connected to the second associated bit line using the reference current provided by a digitally controlled reference current generator connected to the first associated bit line.

14. The semiconductor dynamic random access memory device of claim 13 further including a control unit, coupled to the first digitally controlled reference current generator, to generate the associated reference current control word for each reference current generator.

15. The semiconductor dynamic random access memory device of claim 14 wherein the control unit uses a successive approximation technique to determine the reference current control word for at least one reference current generator.

16. The semiconductor dynamic random access memory device of claim 15 wherein the control unit is selectively coupled to the sense amplifier associated with the at least one reference current generator to execute the successive approximation technique that determines the reference current control word.

17. The semiconductor dynamic random access memory device of claim 13 wherein the reference current control words are provided to the reference current generators during an initialization sequence.

18. The semiconductor dynamic random access memory device of claim 13 wherein the reference current control words are provided to the reference current generators during normal operation.

19. The semiconductor dynamic random access memory device of claim 1 further including a control unit to generate the reference current control words during normal operation of the memory device, and wherein the reference current control words are provided to the reference current generators during normal operation.

20. The semiconductor dynamic random access memory device of claim 13 wherein the bit line layout is an open bit line architecture.

21. The semiconductor dynamic random access memory device of claim 13 wherein the bit line layout is a folded bit line architecture.

22. A semiconductor dynamic random access memory device comprising:
   a plurality of bit lines, including first and second bit lines;
   a sense amplifier, having a first input coupled to the first bit line and a second input coupled to the second bit line;
   a first reference current generator, selectively coupled to the first bit line, to generate a first reference current in response to a reference current control word;
   a second reference current, selectively coupled to the second bit line, to generate a second reference current in response to the reference current control word;
   a plurality of memory cells, including a first memory cell coupled to the first bit line and a second memory cell coupled to the second bit line, wherein the memory cells each store a first data state and a second data state, and wherein each memory cell includes:
     at least one transistor including a source region, a drain region, a body region disposed between and adjacent to the source region and the drain region, wherein the body region is electrically floating, and a gate spaced apart from, and capacitively coupled to, the body region; and
     wherein the transistor includes a first state which is representative of a first charge in the body region and a second state which is representative of a second charge in the body region;
   wherein the memory cell is in: (1) the first data state when the transistor is in the first state and (2) the second data state when the transistor is in the second state; and
   wherein the sense amplifier uses: (1) the first reference current to sense whether the second memory cell is in the first data state or the second data state and (2) the second reference current to sense whether the first memory cell is in the first data state or the second data state.

23. The semiconductor dynamic random access memory device of claim 22 further including a control unit, coupled to the first reference current generator, to adjust the first reference current generated by the first reference current generator.

24. The semiconductor dynamic random access memory device of claim 23 wherein the control unit uses a successive approximation technique to determine the reference current control word.

25. The semiconductor dynamic random access memory device of claim 24 wherein the control unit is selectively coupled to the sense amplifier to execute the successive approximation technique that determines the reference current control word.

26. The semiconductor dynamic random access memory device of claim 22 wherein the first and second reference current generators are digitally controlled reference current generators.

27. The semiconductor dynamic random access memory device of claim 22 further including a control unit to generate the reference current control word during an initialization sequence of the memory device.

28. The semiconductor dynamic random access memory device of claim 22 further including a control unit to generate the reference current control word during normal operation of the memory device.

29. The semiconductor dynamic random access memory device of claim 22 wherein the first and second reference current generators are analog reference current generators.

30. The semiconductor dynamic random access memory device of claim 22 wherein the layout of the first and second bit lines is an open bit line architecture.

31. The semiconductor dynamic random access memory device of claim 22 wherein the layout of the first and second bit lines is a folded bit line architecture.

* * * * *

UNITED STATES PATENT AND TRADEMARK OFFICE
CERTIFICATE OF CORRECTION

PATENT NO. : 6,912,150 B2
DATED : June 28, 2005
INVENTOR(S) : Portmann et al.

It is certified that error appears in the above-identified patent and that said Letters Patent is hereby corrected as shown below:

Title page,
Item [12], delete "Portman et al." and insert -- Portmann et al. --.
Item [75], Inventors, delete "Portman" and insert -- Portmann --.

Signed and Sealed this

Fourth Day of April, 2006

JON W. DUDAS
*Director of the United States Patent and Trademark Office*